(12) United States Patent
Kim

(10) Patent No.: US 12,322,737 B2
(45) Date of Patent: Jun. 3, 2025

(54) LIGHT EMITTING DISPLAY DEVICE

(71) Applicant: LG Display Co., Ltd., Seoul (KR)

(72) Inventor: Jin Yeong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 480 days.

(21) Appl. No.: 17/772,120

(22) PCT Filed: Mar. 12, 2020

(86) PCT No.: PCT/KR2020/003428
§ 371 (c)(1),
(2) Date: Apr. 26, 2022

(87) PCT Pub. No.: WO2021/085755
PCT Pub. Date: May 6, 2021

(65) Prior Publication Data
US 2022/0375906 A1 Nov. 24, 2022

(30) Foreign Application Priority Data
Oct. 29, 2019 (KR) .......................... 10-2019-013590

(51) Int. Cl.
*H01L 25/075* (2006.01)
*G09G 3/32* (2016.01)
*H10H 20/857* (2025.01)

(52) U.S. Cl.
CPC .......... *H01L 25/0753* (2013.01); *G09G 3/32* (2013.01); *H10H 20/857* (2025.01); *G09G 2310/0278* (2013.01)

(58) Field of Classification Search
CPC ..... H01L 25/16; H01L 25/167; H01L 25/075; H01L 25/0753; H10H 20/857; H10D 30/01; H10D 30/0295; G09G 3/32; G09G 2310/0278; G09G 2330/10; G09G 3/3266; H10K 59/35; H10K 59/40; H10K 59/65; H10K 59/121; H10K 59/131; H10K 59/353; H10K 59/1213
USPC .......................................................... 257/79
See application file for complete search history.

(56) References Cited

U.S. PATENT DOCUMENTS

| | | | |
|---|---|---|---|
| 6,411,268 B1 | 6/2002 | Nakamura et al. | |
| 10,235,944 B2 | 3/2019 | Lee et al. | |
| 11,362,072 B2 * | 6/2022 | Qiang | ................... H01L 25/167 |
| 2009/0315874 A1 | 12/2009 | Kim | |
| 2018/0342206 A1 | 11/2018 | Zhou et al. | |
| 2020/0184884 A1 * | 6/2020 | Lau | ..................... H10H 20/8512 |

FOREIGN PATENT DOCUMENTS

| | | |
|---|---|---|
| CN | 1987971 A | 6/2007 |
| CN | 106991967 A | 7/2017 |
| CN | 107393464 A | 11/2017 |
| CN | 107507568 A | 12/2017 |
| EP | 3633660 A1 | 4/2020 |

(Continued)

*Primary Examiner* — Chuong A Luu
(74) *Attorney, Agent, or Firm* — Seed IP Law Group LLP

(57) ABSTRACT

A light emitting display device according to an embodiment of the present disclosure includes a display panel including a unit pixel, a first LED disposed in the unit pixel, and a second LED disposed in the unit pixel and emitting light of the same color as the first LED. When the first LED and the second LED are able to emit light normally, the first LED and the second LED alternately emit light.

5 Claims, 19 Drawing Sheets

(56) References Cited

FOREIGN PATENT DOCUMENTS

| | | |
|---|---|---|
| JP | 2008-116626 A | 5/2008 |
| KR | 10-2000-0048372 A | 7/2000 |
| KR | 10-2007-0066847 A | 6/2007 |
| KR | 10-2009-0131405 A | 12/2009 |
| KR | 20150045597 A | 4/2015 |
| KR | 10-2017-0129319 A | 11/2017 |
| KR | 20180121292 A | 11/2018 |

* cited by examiner

LIGHT EMITTING DISPLAY DEVICE

BACKGROUND

Technical Field

The present disclosure relates to a light emitting display device, and more particularly, to a light emitting display device capable of alternately driving light emitting elements that emit light of the same color of the light emitting display device and simultaneously preventing defective pixels from being recognized in preparation for pixel defects.

Description of the Related Art

Currently, as it enters a full-scale information era, a field of a display device which visually expresses electrical information signals has been rapidly developed and studies are continued to improve performances of various display devices such as a thin-thickness, a light weight, and low power consumption.

Among various display devices, a light emitting display device is a self-light emitting display device, and can be manufactured to be light and thin since it does not require a separate light source, unlike a liquid crystal display device. In addition, since the light emitting display device has advantages in terms of power consumption due to a low voltage driving, and is also excellent in terms of a color implementation, a response speed, a viewing angle, and a contrast ratio (CR), it is expected to be utilized in various fields.

BRIEF SUMMARY

As a light emitting display device, a light emitting display device including a light emitting diode (LED) that is manufactured by transferring LED of a micro-unit to a thin film transistor array substrate is being used. The LED is a light emitting element that has recently been spotlighted because it has not only a fast-lighting speed, but also has low power consumption and excellent stability due to strong impact resistance, and can display high luminance images. However, in a process of manufacturing a light emitting display device including the LED, pixel defects may occur, and thus reliability of the light emitting display device is defective.

For example, since LEDs are very small with a micro level, in a process of transferring the LED to a thin film transistor array substrate, there may be a limitation in that poor contact between the LED and the thin film transistor array substrate occurs even with minute errors. Accordingly, a defective pixel in which the LED does not emit light or emits light abnormally may occur.

Accordingly, the inventors of the present disclosure have invented a light emitting display device having a new structure in preparation for LED transfer defects. Specifically, a redundancy LED element is separately configured in a unit pixel. The redundancy LED element may also be referred to as a supplementary LED element or an additional LED element according to some embodiments. Accordingly, a main LED is used as a main light emitting element, and the redundancy LED is configured to operate instead of the main LED when a defect occurs in the main LED of a specific pixel. Accordingly, in preparation for a defect in the light emitting element, reliability of the light emitting display device is improved.

However, the inventors of the present disclosure have recognized a limitation in that the redundancy LED is not used at all when no defect occurs in the light emitting display device having a structure described above, thereby resulting in disadvantages in terms of a cost or process.

For example, in one example light emitting display device, the redundancy LED is driven only when the main LED is determined to be defective. That is, when the main LED is normally driven, the redundancy LED is not driven as the main LED is normally driven. Accordingly, a cost and process invested in the redundancy LED of a high cost and a driving circuit for driving the redundancy LED can be all recognized as waste.

Accordingly, the inventors of the present disclosure have invented a light emitting display device having a new structure that can reduce recognition of defective pixels by alternately driving sub-pixels emitting light of the same color.

One or more embodiments of the present disclosure provide a light emitting display device capable of reducing a decrease in cost and driving efficiency by driving both a main LED and a redundancy LED even when no defective pixels occur. For example, the light emitting display device alternately drives the main LED and the redundancy LED even when no defects are found in any one of the main LED and the redundancy LED.

In addition, some embodiments of the present disclosure provide a light emitting display device having an increased lifespan. That is, by alternately driving the main LED and the redundancy LED, the overall life expectancy of each of the LED is increased thereby in turn improving the life cycle of the light emitting display device.

In addition, some embodiments of the present disclosure provide a light emitting display device in which a defective pixel or dark line is not recognized by a user when the defective pixel or dark line occurs.

In addition, some embodiments of the present disclosure provide a light emitting display device that improves user text recognition, prevents a diagonal line from being recognized as a step phenomenon, and makes a screen look full to a user.

The technical benefits of the present disclosure are not limited to the above-mentioned benefits, and other benefits, which are not mentioned above, can be clearly understood by those skilled in the art from the following descriptions.

A light emitting display device according to an embodiment of the present disclosure includes a display panel including a unit pixel; a first LED disposed in the unit pixel; and a second LED disposed in the unit pixel and emitting light of the same color as the first LED, wherein when the first LED and the second LED are able to emit light normally, the first LED and the second LED alternately emit light.

A light emitting display device according to another embodiment of the present disclosure includes a display panel in which a plurality of data lines and a plurality of gate lines are disposed and a plurality of unit pixels are disposed, a data driver connected to the plurality of data lines, a gate driver connected to the plurality of gate lines, and a plurality of first LEDs and a plurality of second LEDs that are disposed in the plurality of unit pixels. A first LED and a second LED that emit light of the same color among the plurality of first LEDs and the plurality of second LEDs are driven by the gate lines different from each other and the data lines identical to each other. The data driver applies a data voltage so that the first LED and the second LED are alternately driven.

Other detailed matters of the embodiments are included in the detailed description and the drawings.

As described previously, according to the present disclosure, a lifespan of a light emitting display device can be improved by alternately driving two sub-pixels emitting light of the same color in one pixel.

In addition, according to the present disclosure, it is possible to reduce recognition of defective pixels or dark lines by a user by alternately driving two sub-pixels emitting light of the same color in one pixel.

According to the present disclosure, a driving frequency and resolution recognized by a user can be increased by alternately driving two sub-pixels emitting light of the same color in one pixel.

According to the present disclosure, it is possible to improve user text recognition, to prevent a diagonal line from being recognized as a step phenomenon, and to make a screen look full to a user.

The effects according to the present disclosure are not limited to the contents exemplified above, and more various effects are included in the present specification.

DETAILED DESCRIPTION

Figure 1:
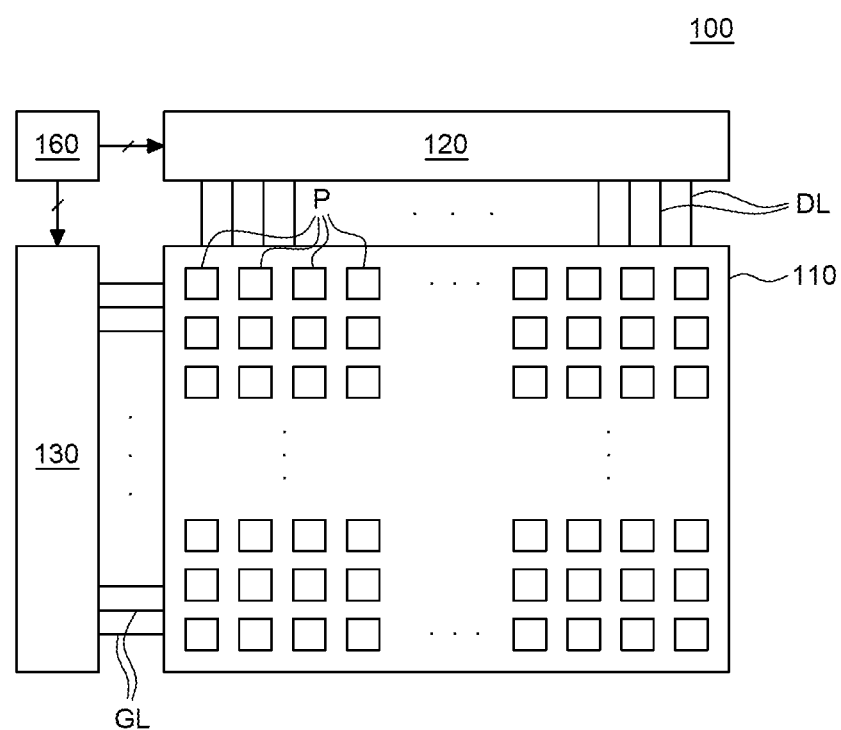
FIG. 1 is a schematic diagram of a light emitting display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated even though the dimensions including the size and thickness of the components illustrated in the drawings are actual working embodiments of the present disclosure.

The features of various embodiments of the present disclosure can be partially or entirely adhered to or combined with each other and can be interlocked and operated in technically various ways, and the embodiments can be carried out independently of or in association with each other.

Hereinafter, a light emitting display device according to embodiments of the present disclosure will be described in detail with reference to accompanying drawings.

Figure 2:
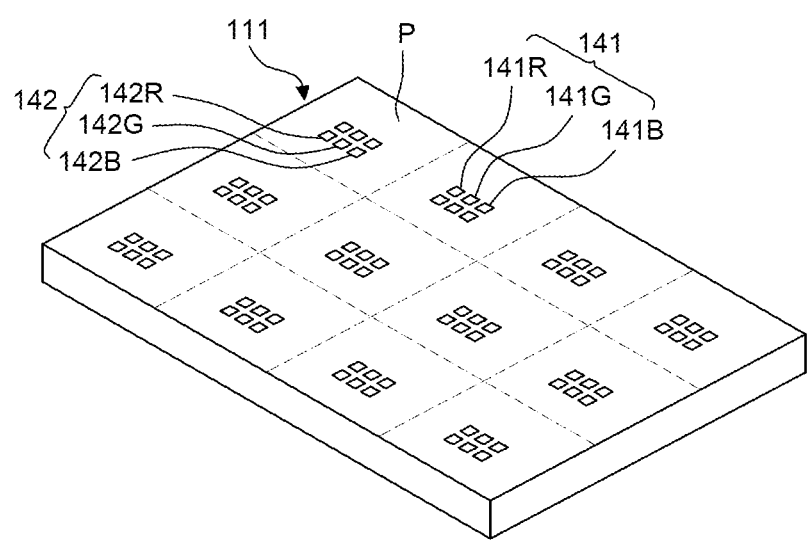
FIG. 2 is a schematic perspective view of the light emitting display device according to an embodiment of the present disclosure.
Figure 3:
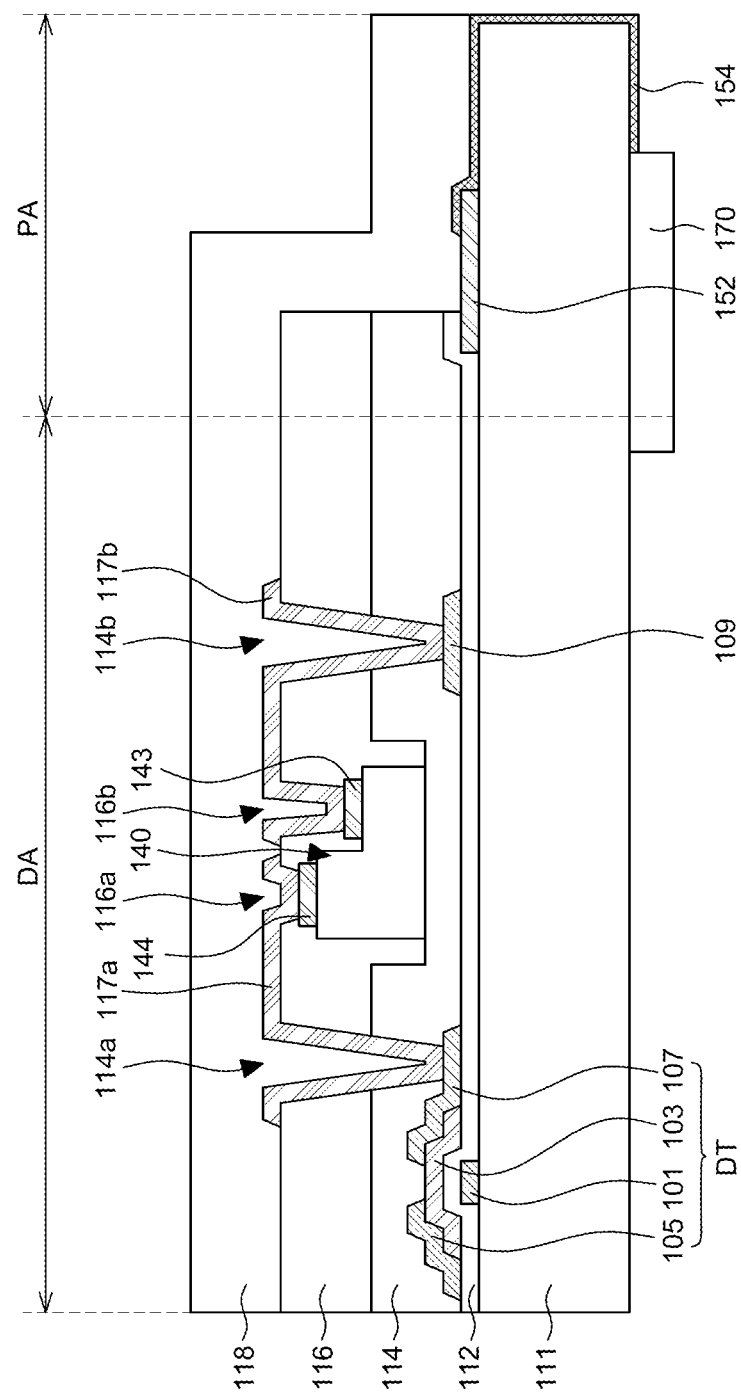
FIG. 3 is a cross-sectional view of the light emitting display device according to an embodiment of the present disclosure.
Figure 4:
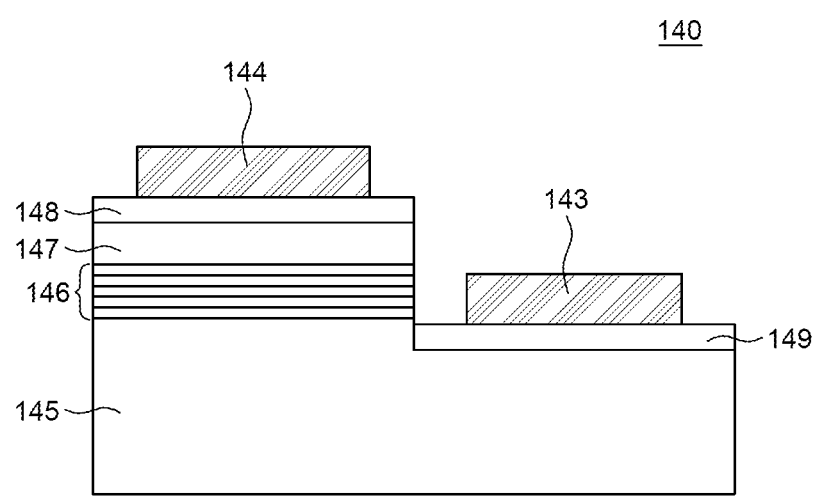
FIG. 4 is a cross-sectional view of an LED of the light emitting display device according to an embodiment of the present disclosure.

FIG. 1 is a schematic diagram of a light emitting display device according to an embodiment of the present disclosure. FIG. 2 is a schematic perspective view of the light emitting display device according to an embodiment of the present disclosure. FIG. 3 is a cross-sectional view of the light emitting display device according to an embodiment of the present disclosure. FIG. 4 is a cross-sectional view of an LED of the light emitting display device according to an embodiment of the present disclosure. Referring to FIG. 1, a light emitting display device 100 includes a display panel 110, a gate driver 130, a data driver 120, and a timing controller 160.

The display panel 110 is a panel for displaying an image. The display panel 110 may include various circuits, lines, and light emitting elements that are disposed on a substrate. The display panel 110 is divided by a plurality of data lines DL and a plurality of gate lines GL that cross each other, and may include a plurality of unit pixels P that are connected to the plurality of data lines DL and the plurality of gate lines GL. The display panel 110 may include a display area DA that is defined by the plurality of unit pixels P and a non-display area in which various signal lines or pads and the like are formed. The display panel 110 may be implemented as a display panel 110 that is used in various light emitting display devices, such as a liquid crystal display device, a light emitting display device using an organic light emitting element or LED, and an electrophoretic display device. Hereinafter, it will be described that the display panel 110 is a panel used in the light emitting display device, but is not limited thereto.

The timing controller 160 receives timing signals such as a vertical synchronization signal, a horizontal synchronization signal, a data enable signal, and a dot clock and the like through a receiving circuit such as an LVDS or TMDS interface that is connected to a host system. The timing controller 160 generates timing control signals for controlling the data driver 120 and the gate driver 130 based on the timing signal input thereto.

The data driver 120 is connected to the plurality of data lines DL of the display panel 110 and supplies a data voltage Vdata to the plurality of unit pixels P. The data driver 120 may include a plurality of source drive integrated circuits (ICs). The plurality of source drive ICs may receive digital video data RGB and a source timing control signal DDC from the timing controller 160. The plurality of source drive ICs may generate the data voltage Vdata by converting the digital video data RGB into a gamma voltage in response to the source timing control signal DDC, and supply the data voltage Vdata through the plurality of data lines DL of the display panel 110. The plurality of source drive ICs may be connected to the plurality of data lines DL of the display panel 110 by a chip on glass (COG) process or a tape automated bonding (TAB) process. Also, the plurality of source drive ICs may be formed on the display panel 110 or may be formed on a separate PCB substrate and connected to the display panel 110.

The gate driver 130 is connected to the plurality of gate lines GL of the display panel 110 and supplies gate signals to the plurality of unit pixels P. The gate driver 130 may include a level shifter and a shift register. The level shifter may shift a level of a clock signal CLK which is input as a transistor-transistor-logic (TTL) level from the timing controller 160 and then, supply it to the shift register. The shift register may be formed in the non-display area of the display panel 110 by a GIP method, but is not limited thereto. The shift register may be comprised of a plurality of stages that shift and output the gate signals in response to the clock signal CLK and a driving signal. The plurality of stages included in the shift register may sequentially output the gate signals through a plurality of output terminals.

Referring to FIG. 2, LEDs 140 (e.g., including first LEDs 141 and second LEDs 142) are disposed in each of unit pixels P of the light emitting display device 100 according to an embodiment of the present disclosure.

The LEDs 140 include first LEDs 141 and second LEDs 142. The first LEDs 141 and the second LEDs 142 are disposed in lines within the unit pixel P of the display panel 110, and the first LEDs 141 and the second LEDs 142 are disposed adjacent to each other.

The first LEDs 141 are disposed in a first row of the unit pixel P. The first LEDs 141 are configured of elements emitting light of different colors. For example, the first LEDs 141 include a first red LED 141R, a first green LED 141G, and a first blue LED 141B.

The second LEDs 142 are disposed in a second row of the unit pixel P. The second LEDs 142 are configured of elements emitting light of the same colors as the first LEDs 141. For example, the second LEDs 142 include a second red LED 142R, a second green LED 142G, and a second blue LED 142B. However, the present disclosure is not limited thereto, and the first LEDs 141 and the second LEDs 142 may further include a white LED for implementing a white sub-pixel. In addition, types and the number of LEDs constituting the first LEDs 141 and the second LEDs 142 may be variously configured according to embodiments. In the present specification, when two LEDs emit light of the same color, it means a case in which LEDs themselves have the same design and are manufactured to emit light of the same color. For example, when LEDs are identical to each other in terms of a material constituting the LEDs and a stacked structure, it may be defined that two LEDs emit light of the same color. At this time, even if the color of light emitted by the LEDs is changed according to a manufacturing deviation or long-term use time of the LEDs, when it is determined that the two LEDs are designed to emit light of the same color at the time of initial manufacture, the two LEDs can be defined as emitting light of the same color.

Referring to FIGS. 3 and 4, the light emitting display device 100 according to an embodiment of the present disclosure includes a substrate 111, the LED 140, a driving transistor DT, and a circuit module 170. Hereinafter, the light emitting display device 100 is described as a top emission type light emitting display device, but is not limited thereto.

The substrate 111 includes a display area DA and a pad area PA.

The display area DA is an area in which an image is displayed in the light emitting display device 100 and includes the plurality of unit pixels P. In the display area DA, the LED 140 that is a display element, and the driving transistor DT that is a driving element for driving the LED 140 that is the display element, and various lines may be formed.

In the pad area PA, driver ICs that supply signals for driving the plurality of unit pixels P, flexible films, and a pad 152 may be disposed.

Referring to FIG. 3, the substrate 111 is disposed at a lower portion of the light emitting display device 100. The substrate 111 may support and protect components of the light emitting display device 100. The substrate 111 may be formed of a transparent material such as glass. However, the present disclosure is not limited thereto.

The driving transistor DT is disposed on the substrate 111. The driving transistor DT may be used as a driving element of the light emitting display device 100. The driving transistor DT includes a gate electrode 101, an active layer 103, a source electrode 105, and a drain electrode 107.

In the light emitting display device 100 according to an embodiment of the present disclosure, the driving transistor DT is illustrated as a driving transistor having a bottom gate structure in which the gate electrode 101 is disposed at a lowermost portion, the active layer 103 is disposed on the gate electrode 101, and the source electrode 105 and the drain electrode 107 are disposed on the active layer 103, but the present disclosure is not limited thereto.

The gate electrode 101 of the driving transistor DT is disposed on the substrate 111. The gate electrode 101 may be any one of various metallic materials, for example, tantalum (Ta), molybdenum (Mo), aluminum (Al), chromium (Cr), gold (Au), titanium (Ti), nickel (Ni), neodymium (Nd), and copper (Cu), or an alloy of two or more of them, or a multiple layer thereof, but is not limited thereto.

A gate insulating layer 112 is disposed on the gate electrode 101 of the driving transistor DT. The gate insulating layer 112 is a layer for electrically insulating the gate electrode 101 and the active layer 103 and may be formed of an insulating material. For example, the gate insulating layer 112 may be formed of a single layer of silicon nitride (SiNx) or silicon oxide (SiOx) which is an inorganic material or a multiple layer of silicon nitride (SiNx) or silicon oxide (SiOx), but is not limited thereto.

The active layer 103 is disposed on the gate insulating layer 112. The active layer 103 is disposed to overlap the gate electrode 101. For example, the active layer 103 may be formed of an oxide semiconductor, an amorphous semiconductor such as amorphous silicon (a-Si), polycrystalline silicon (poly-Si), or an organic semiconductor, but is not limited thereto.

Although not shown in FIG. 3, an etch stopper may be disposed on the active layer 103. The etch stopper may be a layer that is formed to prevent a surface of the active layer 103 from being damaged by plasma when the source electrode 105 and the drain electrode 107 are patterned and formed by an etching method.

The source electrode 105 and the drain electrode 107 are disposed on the active layer 103. The source electrode 105 and the drain electrode 107 are disposed to be spaced apart from each other in the same layer. The source electrode 105 and the drain electrode 107 may be electrically connected to the active layer 103 in a manner in contact with the active layer 103. In this case, the drain electrode 107 may be used as a first electrode for applying a signal to the LED 140. The source electrode 105 and the drain electrode 107 may be any one of various metallic materials, for example, tantalum (Ta), molybdenum (Mo), aluminum (Al), chromium (Cr), gold (Au), titanium (Ti), nickel (Ni), neodymium (Nd), and copper (Cu), or an alloy of two or more of them, or a multiple layer thereof, but is not limited thereto. In addition, although FIG. 3 shows that the drain electrode 107 can be used as an electrode for applying a signal to the LED 140, it is not limited thereto, and the source electrode 105 may be used as an electrode for applying a signal to the LED 140.

A second electrode 109 is disposed on the gate insulating layer 112. The second electrode 109 is disposed to be spaced apart from the source electrode 105 and the drain electrode 107 in the same layer. In this case, the second electrode 109 may be any one of various metallic materials, for example, tantalum (Ta), molybdenum (Mo), aluminum (Al), chromium (Cr), gold (Au), titanium (Ti), nickel (Ni), neodymium (Nd), and copper (Cu), or an alloy of two or more of them, or a multiple layer thereof, but is not limited thereto. The second electrode 109 may be formed of the same material as and formed simultaneously with the drain electrode 107 of the driving transistor DT through the same process, for example, a mask process, but is not limited thereto.

A first insulating layer 114 is disposed on the driving transistor DT. The first insulating layer 114 may be disposed over the driving transistor DT and protect the driving transistor DT. The first insulating layer 114 may be formed of one of photoacryl, acrylic resin, epoxy resin, phenol resin, polyamide-based resin, polyimide-based resin, unsaturated polyester-based resin, polyphenylene-based resin, polyphenylene sulfide-based resin, benzocyclobutene and photoresist, but is not limited thereto, and may be configured in a multilayer structure such as an inorganic layer/organic layer or an inorganic layer/organic layer/inorganic layer.

The LED 140 is disposed on the first insulating layer 114. The LED 140 may be electrically connected to the drain electrode 107 through a plurality of contact holes formed in the first insulating layer 114. Although FIG. 3 illustrates that the LED 140 is disposed on the first insulating layer 114 that is patterned, it is not limited thereto, and the LED 140 may be disposed on the first insulating layer 114 that is not patterned.

The LED 140 may be formed of a Group III-V nitride semiconductor material, but is not limited thereto. Although FIG. 3 shows that an LED having a lateral structure is disposed as the LED 140, it is not limited thereto, and LEDs having various structures such as a vertical structure may be disposed.

The LED 140 may be manufactured by a process separate from a TFT array process of the substrate 111. For example, the LED 140 may be formed on a growth substrate such as sapphire, and may be attached to the substrate 111 on which the driving transistor DT and various lines are disposed through a transfer process, but is not limited thereto.

A detailed description of the LED 140 will be described later with reference to FIG. 4.

A second insulating layer 116 is disposed on the LED 140 and the first insulating layer 114. An upper surface of the second insulating layer 116 has a face parallel to the substrate 111. Accordingly, the second insulating layer 116 may planarize a step that may occur due to components disposed thereunder. The second insulating layer 116 may be formed of one of photoacryl, acrylic resin, epoxy resin, phenol resin, polyamide-based resin, polyimide-based resin, unsaturated polyester-based resin, polyphenylene-based resin, polyphenylene sulfide-based resin, benzocyclobutene and photoresist, but is not limited thereto, and may be configured in a multilayer structure such as an inorganic layer/organic layer or an inorganic layer/organic layer/inorganic layer.

Meanwhile, in FIG. 3, the first insulating layer 114 and the second insulating layer 116 are illustrated as separate insulating layers, but are not limited thereto, and the first insulating layer 114 and the second insulating layer 116 may be configured integrally.

A first connection electrode 117a and a second connection electrode 117b are disposed on the second insulating layer 116.

The first connection electrode 117a may electrically connect the drain electrode 107 of the driving transistor DT and a p-type electrode 144 of the LED 140 through a first contact hole 114a and a third contact hole 116a that are formed in the first insulating layer 114 and the second insulating layer 116. The first connection electrode 117a may be formed of a transparent metal oxide such as indium tin oxide (ITO), indium gallium zinc oxide (IGZO), or indium gallium oxide (IGO).

The second connection electrode 117b may electrically connect the second electrode 109 and an n-type electrode 143 of the LED 140 through the second contact hole 114b and the fourth contact hole 116b that are formed in the first insulating layer 114 and the second insulating layer 116. The second connection electrode 117b may be formed of a transparent metal oxide such as indium tin oxide (ITO), indium gallium zinc oxide (IGZO), or indium gallium oxide (IGO).

The pad 152 is disposed in the pad area PA. The pad 152 is disposed on the substrate 111. The pad 152 may be any one of various metallic materials, for example, tantalum (Ta), molybdenum (Mo), aluminum (Al), chromium (Cr), gold (Au), titanium (Ti), nickel (Ni), neodymium (Nd), and copper (Cu), or an alloy of two or more of them, or a multiple layer thereof, but is not limited thereto. The pad 152 may be formed of the same material as and formed simultaneously with the gate electrode 101 of the driving transistor DT through the same process. Although FIG. 3 illustrates that the pad 152 is disposed on the substrate 111, the pad 152 may be disposed on the gate insulating layer 112, and may be formed of the same material as and formed simultaneously with the source electrode 105 and the drain electrode 107 through the same process, but is not limited thereto.

The circuit module 170 is disposed under the substrate 111. The circuit module 170 may be disposed under the substrate 111 and reduce a bezel area of the light emitting display device 100. Although FIG. 3 illustrates that the substrate 111 is a single substrate and the circuit module 170 is disposed on a lower surface of the substrate 111, it is not limited thereto, and the substrate 111 is composed of two sub-substrates, the LED 140 being mounted on an upper sub-substrate, the circuit module 170 being mounted on a lower sub-substrate, and the two sub-substrates may be bonded by an adhesive layer or the like.

The circuit module 170 may be a printed circuit board (PCB) in which various lines electrically connected to circuits such as the timing controller 160, a memory such as an EEPROM or the like, and a voltage source for driving the LED 140, and a link line 154 are formed, and may be a PCB in which the gate driver 130 and the data driver 120 that apply signals to the plurality of gate lines GL and the plurality of data lines DL, respectively, are formed.

The link line 154 is disposed on an upper surface, a side surface, and a rear surface of the substrate 111 in the pad area PA. The link line 154 electrically connects the pad 152 and the circuit module 170. The link line 154 may be disposed so that a signal output from the circuit module 170 may be applied to the pad 152.

A buffer layer 118 is disposed on a portion of the upper surface, the side surface, and the rear surface of the substrate 111. The buffer layer 118 is formed of an inorganic material or an organic material and may be disposed to cover upper portions of the LED 140 and the link line 154.

Although not shown in FIG. 3, a buffer layer may be further disposed on the substrate 111 of the LED 140. When a gallium nitride (GaN) thin film growth substrate as a buffer layer is disposed on the substrate 111, the LED 140 may be manufactured by growing a gallium nitride (GaN) thin film. When the buffer layer is formed of a material other than the gallium nitride (GaN) thin film growth substrate, aluminum nitride (AlN), gallium nitride (GaN) or the like may be further disposed in order to reduce lattice mismatch that occurs when an n-type gallium nitride (GaN) layer 145, which is an epi-layer on the substrate, is directly grown.

Referring to FIG. 4, the LED 140 of the light emitting display device 100 according to an embodiment of the present disclosure includes the n-type gallium nitride (GaN) layer 145, an active layer 146, and a p-type gallium nitride (GaN) layer 147, a first ohmic-contact layer 148, a second ohmic-contact layer 149, the p-type electrode 144, and the n-type electrode 143. The LED 140 may be formed to have a size of about 10 to 100 μm. The LED 140 may be formed in a fine size and transferred to a flexible substrate such as plastic, thereby configuring a flexible display device. In addition, the LED 140 may be transferred onto the substrate 111 of a large area and constitute a large-area display device.

The n-type gallium nitride (GaN) layer 145 is disposed at a lower portion of the LED 140. The n-type gallium nitride (GaN) layer 145 is a layer for supplying electrons to the active layer 146 and may be formed by doping an n-type impurity such as silicon (Si) into a gallium nitride (GaN) semiconductor layer.

The active layer 146 is disposed on the n-type gallium nitride (GaN) layer 145. The active layer 146 is a layer in which electrons and holes are combined to emit light. Although not shown in FIG. 4, a multi-quantum well structure of the active layer 146 is configured such that a plurality of barrier layers and well layers are alternately disposed, the well layer is formed of an indium gallium nitride (InGaN) layer, and the barrier layer is formed of a gallium nitride (GaN) layer, but is not limited thereto.

The p-type gallium nitride (GaN) layer 147 is disposed on the active layer 146. The p-type gallium nitride (GaN) layer 147 is a layer for injecting holes into the active layer 146, and may be formed by doping a p-type impurity such as magnesium (Mg), zinc (Zn), and beryllium (Be) into a gallium nitride (GaN) semiconductor layer.

The first ohmic-contact layer 148 is disposed on the p-type gallium nitride (GaN) layer 147. The first ohmic-contact layer 148 may be a layer that is disposed between the p-type gallium nitride (GaN) layer 147 and the p-type electrode 144 to form an ohmic-contact. The first ohmic-contact layer 148 may be formed of a transparent metal oxide such as indium tin oxide (ITO), indium galium zinc oxide (IGZO), or indium zinc oxide (IZO). However, it is not limited thereto, and the first ohmic-contact layer 148 may not be disposed.

The p-type electrode 144 is disposed on the first ohmic-contact layer 148. The p-type electrode 144 is a layer that is disposed to inject holes from the p-type gallium nitride (GaN) layer 147 into the active layer 146. The p-type electrode 144 may be composed of a single layer or multiple layers formed of at least one metal among nickel (Ni), gold (Au), platinum (Pt), titanium (Ti), aluminum (Al), and chromium (Cr) or an alloy thereof.

The second ohmic-contact layer 149 is disposed on the n-type gallium nitride (GaN) layer 145. The second ohmic-contact layer 149 may be a layer that is disposed between the n-type gallium nitride (GaN) layer 145 and the n-type electrode 143 to form an ohmic-contact. The second ohmic-contact layer 149 may be formed of a transparent metal oxide such as indium tin oxide (ITO), indium galium zinc oxide (IGZO), or indium zinc oxide (IZO). However, it is not limited thereto, and the second ohmic-contact layer 149 may not be disposed.

The n-type electrode 143 is disposed on the second ohmic-contact layer 149. The n-type electrode 143 is a layer that is disposed to inject electrons from the n-type gallium nitride (GaN) layer 145 into the active layer 146. The n-type gallium nitride (GaN) layer 145 may be composed of a single layer or multiple layers formed of at least one metal among nickel (Ni), gold (Au), platinum (Pt), titanium (Ti), aluminum (Al), and chromium (Cr) or an alloy thereof.

The LED 140 is an element that emits light as excitons disappear in the active layer 146. For example, when a voltage is applied to each of the p-type electrode 144 and the n-type electrode 143 of the LED 140, electrons and holes from the p-type gallium nitride (GaN) layer 147 and the n-type gallium nitride (GaN), respectively, are injected into the active layer 146. At this time, electrons and holes recombine to generate excitons. This exciton may emit light as it disappears in the active layer 146. Accordingly, light emitted from the active layer 146 generates light corresponding to an energy difference between a lowest unoccupied molecular orbital (LUMO) and a highest occupied molecular orbital (HOMO) of the active layer 146. Accordingly, a wavelength of light emitted from the LED 140 may be changed according to a thickness of the barrier layer of the multi-quantum well structure of the active layer 146.

The structure of the LED 140 shown in FIGS. 3 and 4 may be a structure that is applied to both the first LED 141 and the second LED 142.

Figure 5:
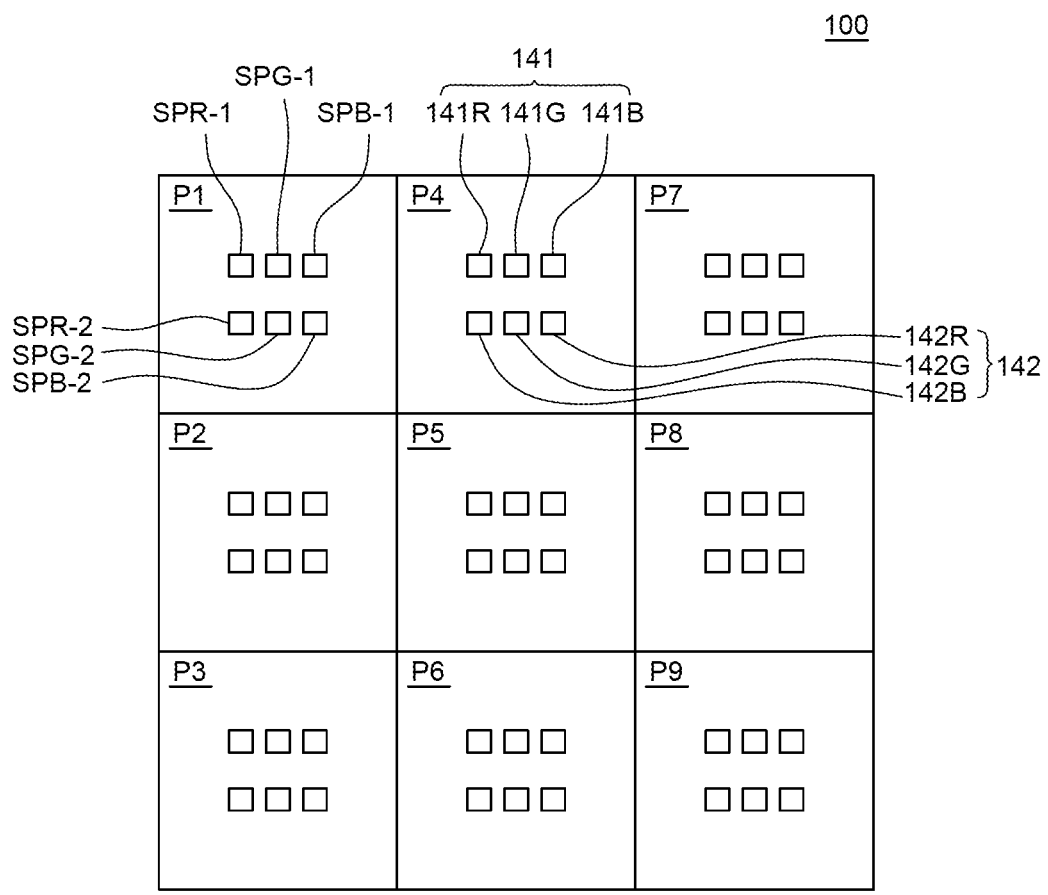
FIG. 5 is a plan view schematically illustrating a plurality of unit pixels of the light emitting display device according to an embodiment of the present disclosure.

FIG. 5 is a plan view schematically illustrating a plurality of unit pixels of the light emitting display device according to an embodiment of the present disclosure. In FIG. 5, only nine unit pixels P (e.g., P1 through P9) disposed in three rows and three columns among the plurality of unit pixels P are illustrated for convenience of explanation. That is, FIG. 5 illustrates only a first unit pixel P1, a fourth unit pixel P4, and a seventh unit pixel P7 that are disposed in a first row, a second unit pixel P2, a fifth unit pixel P5, and an eighth unit pixel P8 that are disposed in a second row, a third unit pixel P3, a sixth unit pixel P6 and a ninth unit pixel P9 that are disposed in a third row, among the plurality of unit pixels P.

A plurality of sub-pixels SP (e.g., SPR-1, SPG-1, SPB-1, SPR-2, SPG-2, SPB-2) are disposed in each of the plurality of unit pixels P. The plurality of unit pixels P may include sub-pixels SP corresponding to the colors of the first LEDs 141 and the second LEDs 142 disposed in each of the unit pixels P. As described above, when the first LEDs 141 include a first red LED 141R, a first green LED 141G, and a first blue LED 141B, and the second LEDs 142 include a second red LED 142R, a second green LED 142G, and a second blue LED 142B, each of the plurality of unit pixels P may include two red sub-pixels, two blue sub-pixels, and two green sub-pixels. Specifically, each unit pixel P may include a first red sub-pixel SPR-1 in which the first red LED 141R is disposed, a first green sub-pixel SPG-1 in which the first green LED 141G is disposed, a first blue sub-pixel SPB-1 in which the first blue LED 141B is disposed, a second red sub-pixel SPR-2 in which the second red LED 142R is disposed, a second green sub-pixel SPG-2 in which the second green LED 142G is disposed, and a second blue sub-pixel SPB-2 in which the second blue LED 142B is disposed, but is not limited thereto.

The plurality of LEDs 140 disposed in the light emitting display device 100 may be spaced apart from each other at different intervals. For example, the plurality of unit pixels P include a plurality of first LEDs 141 and a plurality of second LEDs 142 that are disposed in two lines side by side, and in each unit pixel P, the first LEDs 141 and the second LEDs 142 are spaced apart at the same interval. However, an interval between the first LEDs 141 and the second LEDs 142 that are disposed while having a boundary of the unit pixels P may be different from the interval between the first LEDs 141 and the second LEDs 142 disposed within the unit pixel P. Referring to FIG. 5, a distance between the first LEDs 141 and the second LEDs 142 in the first unit pixel P1 among the plurality of unit pixels P is smaller than a distance between the second LEDs 142 in the first unit pixel P1 and the first LEDs 141 in the second unit pixel P2 adjacent to the first unit pixel P1. However, it is not limited thereto, and each of the first LEDs 141 and the second LEDs 142 may be disposed at the same interval from each other in an entire area of the light emitting display device 100.

The plurality of first LEDs 141 and the plurality of second LEDs 142 are driven by different driving transistors DT. In addition, among the plurality of first LEDs 141 and the plurality of second LEDs 142, the first LEDs 141 and the second LEDs 142 that emit light of the same color may be driven by the gate lines GL different from each other and the data lines DL identical to each other. Hereinafter, FIG. 6 to FIG. 8C are referred together for a more detailed description of driving of the light emitting display device 100 according to an embodiment of the present disclosure.

Figure 6:
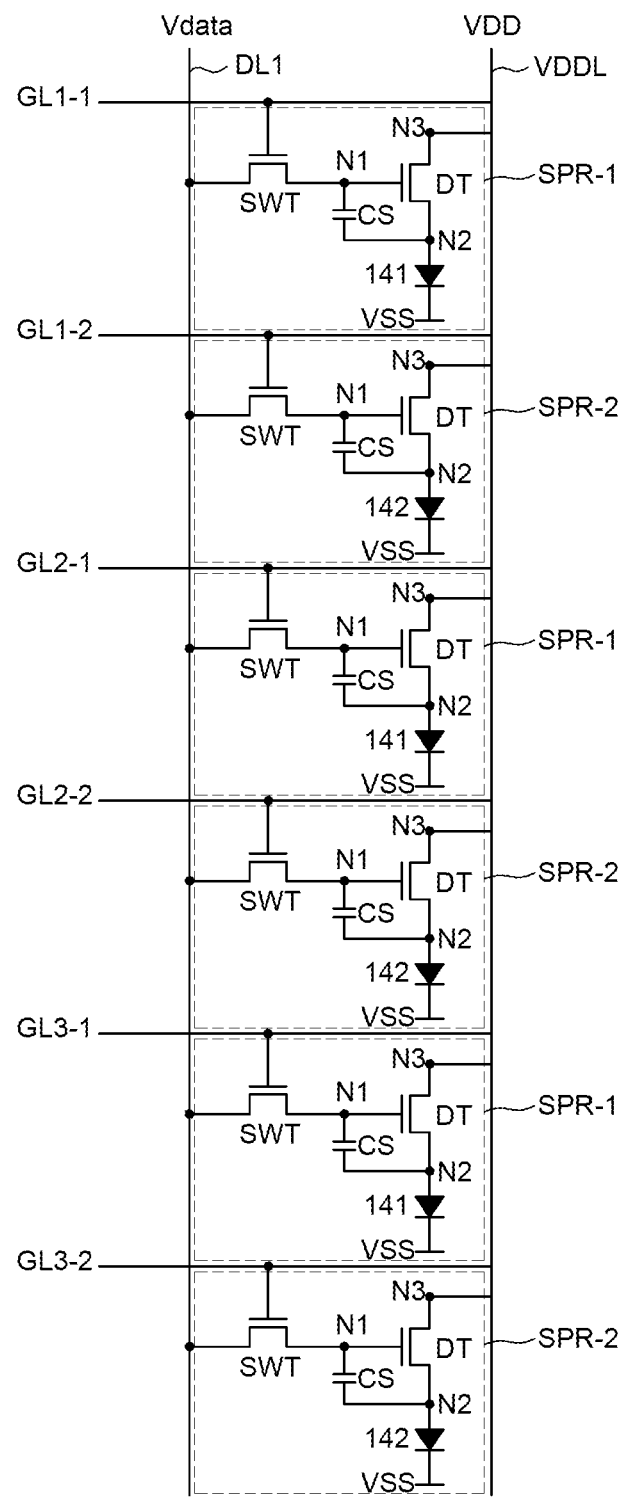
FIG. 6 is a circuit diagram of a plurality of sub-pixels of the light emitting display device according to an embodiment of the present disclosure.

FIG. 6 is a circuit diagram of a plurality of sub-pixels of the light emitting display device according to an embodiment of the present disclosure. FIG. 6 shows a circuit diagram of a plurality of sub-pixels SP disposed in a column direction among the plurality of unit pixels P illustrated in FIG. 5. For example, the circuit diagram shown in FIG. 6 illustrates the first red sub-pixel SPR-1 and the second red sub-pixel SPR-2 disposed in the first unit pixel P1, the first red sub-pixel SPR-1 and the second red sub-pixel SPR-2 disposed in the second unit pixel P2, and the first red sub-pixel SPR-1 and the second red sub-pixel SPR-2 disposed in the third unit pixel P3. Although FIG. 6 illustrates a plurality of red sub-pixels in the unit pixels P disposed in a first column, a plurality of green sub-pixels disposed in the same column direction and a plurality of blue sub-pixels disposed in the same column direction may also be driven in the same manner.

Referring to FIG. 6, each sub-pixel SP includes a switching transistor SWT, a driving transistor DT, and a storage capacitor SC, and includes the first LED 141 or the second LED 142 for each sub-pixel SP. Specifically, the first red LED 141R is disposed in the first red sub-pixel SPR-1, and the second red LED 142R is disposed in the second red sub-pixel SPR-2 in each unit pixel P.

Hereinafter, a pixel circuit disposed in the first red sub-pixel SPR-1 will be described for convenience of description, but configurations of pixel circuits of all the sub-pixels SP may be identical to each other.

The switching transistor SWT is a transistor for transmitting a data voltage Vdata to a first node N1 corresponding to the gate electrode 101 of the driving transistor DT. The switching transistor SWT may include a drain electrode connected to a first data line DL1, a gate electrode connected to a 1-1 gate line GL1-1, and a source electrode connected to the gate electrode 101 of the driving transistor DT.

The driving transistor DT supplies a driving current to the first red LED 141R and drive the first red LED 141R. The driving transistor DT may include the gate electrode 101 corresponding to the first node N1, the source electrode 105 corresponding to a second node N2 and corresponding to an output terminal, and the drain electrode 107 corresponding to the third node N3 and corresponding to an input terminal. The gate electrode 101 of the driving transistor DT may be connected to the switching transistor SWT, the drain electrode 107 of the driving transistor DT may receive a high potential voltage VDD through a high potential voltage line VDDL, and the source electrode 105 of the driving transistor DT may be connected to the p-type electrode 144 of the first LED 141.

The storage capacitor SC may maintain a voltage corresponding to the data voltage Vdata for one frame. One electrode of the storage capacitor SC may be connected to the first node N1, and the other electrode thereof may be connected to the second node N2.

The switching transistor SWT may be disposed between the driving transistor DT and the first data line DL1 and switch an electrical connection between the driving transistor DT and the first data line DL1. The switching transistor SWT may be turned on by a signal applied through the 1-1 gate line GL1-1, and turn on the first red LED 141R connected to the second node N2 of the driving transistor DT. On the other hand, when the switching transistor SWT is turned off, the data voltage Vdata is not applied to the driving transistor DT and the first data line DL1, so that the first red LED 141R connected to the second node N2 of the driving transistor DT may be turned off.

The plurality of sub-pixels SP may be connected to the gate lines GL that are different for respective rows. For example, the first red sub-pixel SPR-1 and the second red sub-pixel SPR-2 disposed in the first unit pixel P1, the first red sub-pixel SPR-1 and the second red sub-pixel SPR-2 disposed in the second unit pixel P2, and the first red sub-pixel SPR-1 and the second red sub-pixel SPR-2 disposed in the third unit pixel P3 may be respectively connected to the 1-1 gate line GL1-1, a 1-2 gate line GL1-2, a 2-1 gate line GL2-1, a 2-2 gate line GL2-2, a 3-1 gate line GL3-1, and a 3-2 gate line GL3-2. Hereinafter, FIGS. 7 to 8C are referred together for a more detailed description of driving of the plurality of sub-pixels SP.

Figure 7:
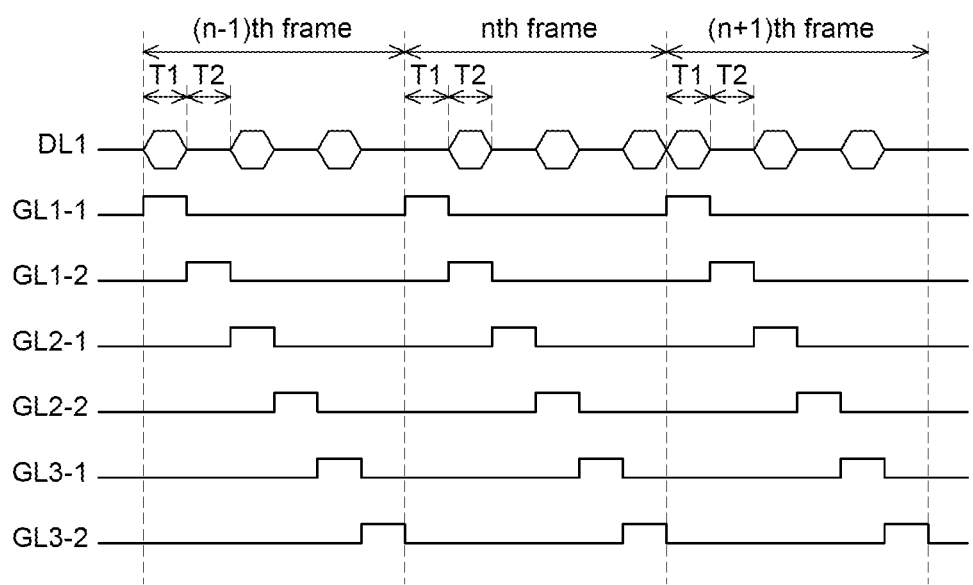
FIG. 7 is a waveform diagram illustrating the light emitting display device according to an embodiment of the present disclosure.
Figure 8A:
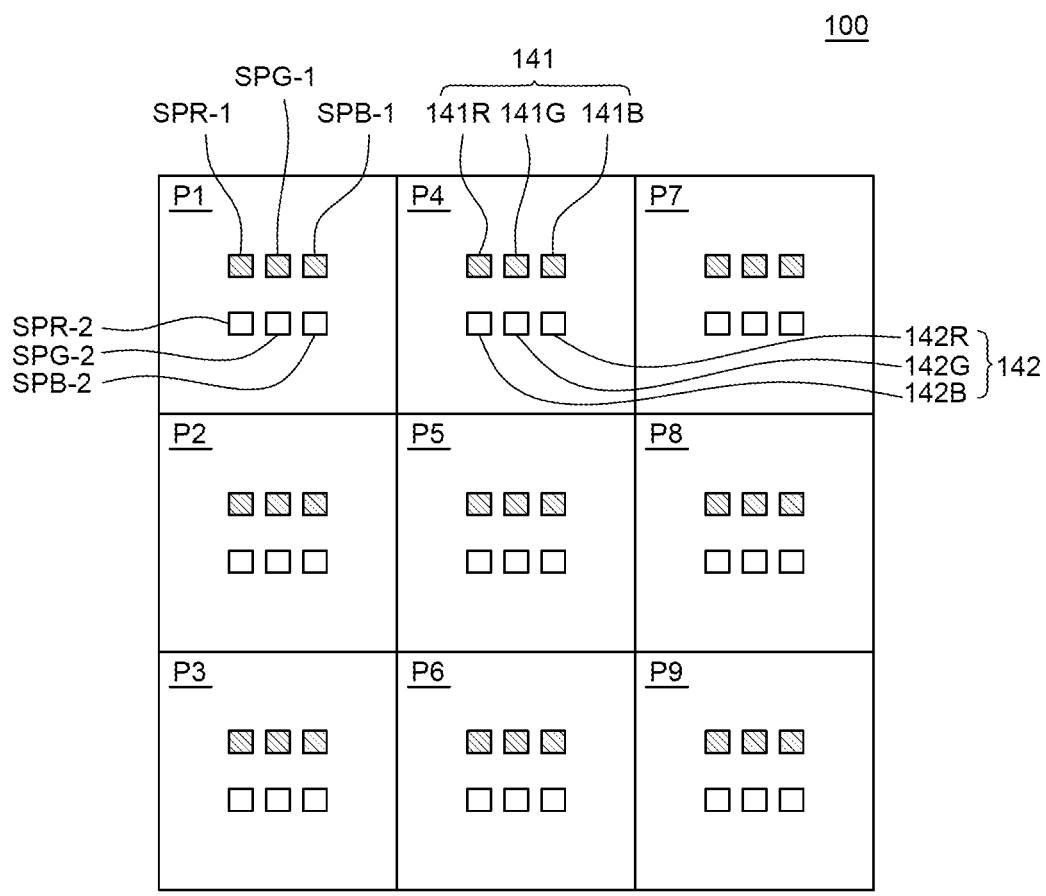
FIGS. 8A to 8C are plan views schematically illustrating a plurality of pixels of the light emitting display device according to an embodiment of the present disclosure, in units of frames.
Figure 8B:
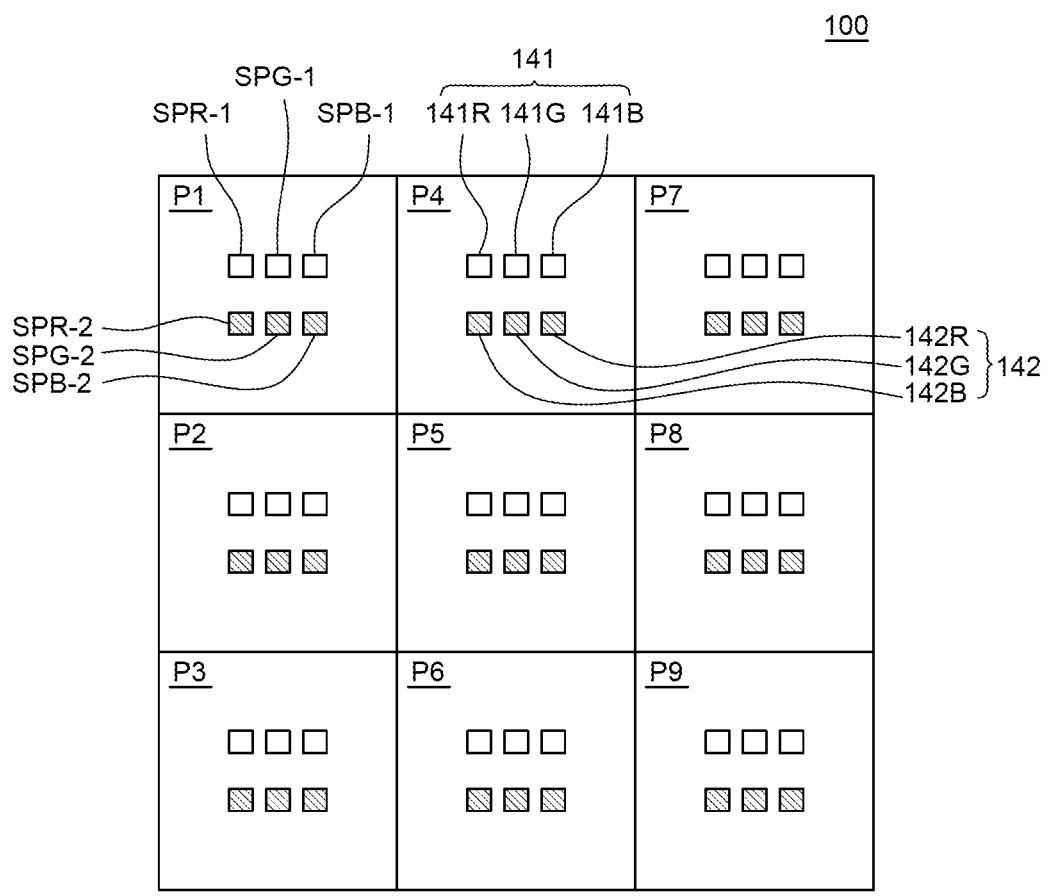
Figure 8C:
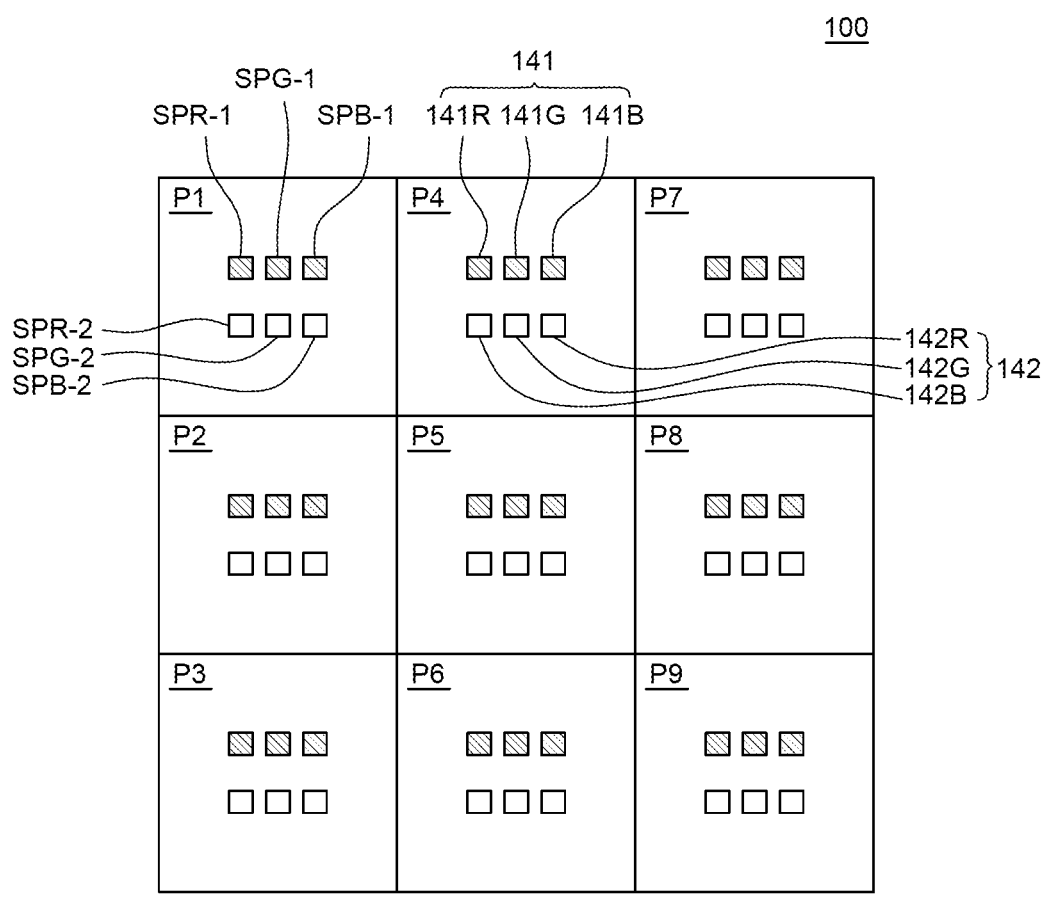

FIG. 7 is a waveform diagram illustrating the light emitting display device according to an embodiment of the present disclosure. FIGS. 8A to 8C are plan views schematically illustrating a plurality of pixels of the light emitting display device according to an embodiment of the present disclosure, in units of frames. FIG. 7 schematically illustrates only data voltages Vdata and gate signals that are input during three frames for convenience of explanation. In FIGS. 8A to 8C, a first unit pixel P1, a second unit pixel P2, a third unit pixel P3, a fourth unit pixel P4, a fifth unit pixel P5, a sixth unit pixel P6, a seventh unit pixel P7, an eighth unit pixel P8, and a ninth unit pixel P9 that operate according to the waveform diagram of FIG. 7, are illustrated in units of frames. In FIGS. 8A to 8C, hatching is shown in sub-pixels that emit light in each frame, and no hatching is shown in sub-pixels that do not emit light in each frame.

Referring to FIGS. 7 and 8A, in an (n−1)th frame, a gate high voltage is applied to the 1-1 gate line GL1-1 during a first period T1. Also, during the first period T1, a data voltage Vdata is applied to the first red sub-pixel SPR-1 of the first unit pixel P1 that is connected to the first data line DL1 and the 1-1 gate line GL1-1. Accordingly, the driving transistor DT of the first red sub-pixel SPR-1 of the first unit pixel P1 is turned on and thus, the first red sub-pixel SPR-1 of the first unit pixel P1 may emit light.

Subsequently, a gate high voltage is applied to the 1-2 gate line GL1-2 during a second period T2. However, in the second period T2, a data voltage Vdata may not be applied to the first data line DL1 or a data voltage Vdata having a lowest value such as a ground voltage may be applied thereto. Accordingly, the driving transistor DT of the second red sub-pixel SPR-2 of the first unit pixel P1 is turned off and thus, the second red sub-pixel SPR-2 of the first unit pixel P1 may not emit light.

The second unit pixel P2 and the third unit pixel P3 may be driven in the same manner as described above. That is, gate signals may be sequentially applied to the 2-1 gate line GL2-1, the 2-2 gate line GL2-2, the 3-1 gate line GL3-1, and the 3-2 gate line GL3-2, respectively, and a data voltage Vdata is applied to the first data line DL1 at a time at which a gate high voltage is applied to the 2-1 gate line GL2-1 and the 3-1 gate line GL3-1, so that the first red sub-pixel SPR-1 of the second unit pixel P2 and the first red sub-pixel SPR-1 of the third unit pixel P3 emit light and the second red sub-pixel SPR-2 of the second unit pixel P2 and the second red sub-pixel SPR-2 of the third unit pixel P3 may not emit light.

Accordingly, during the (n−1)th frame, only a plurality of first red sub-pixels SPR-1 emit light and a plurality of second red sub-pixels SPR-2 may not emit light, among the plurality of red sub-pixels disposed in the plurality of unit pixels P.

Also, the plurality of green sub-pixels and the plurality of blue sub-pixels disposed in the plurality of unit pixels P may be driven in the same manner. Accordingly, during the (n−1)th frame, the first green sub-pixel SPG-1 of the first unit pixel P1, the first green sub-pixel SPG-1 of the second unit pixel P2, and the first green sub-pixel SPG-1 of the third unit pixel P2 may emit light, and the second green sub-pixel SPG-2 of the first unit pixel P1, the second green sub-pixel SPG-2 of the second unit pixel P2, and the second green sub-pixel SPG-2 of the third unit pixel P3 may not emit light. In addition, during the (n−1)th frame, the first blue sub-pixel SPB-1 of the first unit pixel P1, the first blue sub-pixel SPB-1 of the second unit pixel P2, and the first blue sub-pixel SPB-1 of the third unit pixel P3 may emit light, and the second blue sub-pixel SPB-2 of the first unit pixel P1, the second blue sub-pixel SPB-2 of the second unit pixel P2, and the second blue sub-pixel SPB-2 of the third unit pixel P3 may not emit light.

Subsequently, referring to FIGS. 7 and 8B, in an nth frame, a gate high voltage is applied to the 1-1 gate line GL1-1 during a first period T1. However, in the first period T1, a data voltage Vdata may not be applied to the first data line DL1 or a data voltage Vdata having a lowest value such as a ground voltage may be applied thereto. Accordingly, the driving transistor DT of the first red sub-pixel SPR-1 of the first unit pixel P1 is turned off so that the first red sub-pixel SPR-1 of the first unit pixel P1 may not emit light.

Subsequently, a gate high voltage is applied to the 1-2 gate line GL1-2 during the second period T2. In addition, during the second period T2, a data voltage Vdata is applied to the second red sub-pixel SPR-2 of the first unit pixel P1 that is connected to the first data line DL1 and the 1-2 gate line GL1-2. Accordingly, the driving transistor DT of the second red sub-pixel SPR-2 of the first unit pixel P1 is turned on and thus, the second red sub-pixel SPR-2 of the first unit pixel P1 may emit light.

The second unit pixel P2 and the third unit pixel P3 may be driven in the same manner as described above. That is, gate signals may be sequentially applied to the 2-1 gate line GL2-1, the 2-2 gate line GL2-2, the 3-1 gate line GL3-1, and the 3-2 gate line GL3-2, respectively, and a data voltage Vdata is applied to the first data line DL1 at a time at which a gate high voltage is applied to the 2-2 gate line GL2-2 and the 3-2 gate line GL3-2, so that the first red sub-pixel SPR-1 of the second unit pixel P2 and the first red sub-pixel SPR-1 of the third unit pixel P3 may not emit light and the second red sub-pixel SPR-2 of the second unit pixel P2 and the second red sub-pixel SPR-2 of the third unit pixel P3 may emit light.

Accordingly, during the nth frame, the plurality of first red sub-pixels SPR-1 may not emit light and only the plurality of second red sub-pixels SPR-2 may emit light, among the plurality of red sub-pixels disposed in the plurality of unit pixels P.

Also, the plurality of green sub-pixels and the plurality of blue sub-pixels disposed in the plurality of unit pixels P may be driven in the same manner. Accordingly, during the nth frame, the first green sub-pixel SPG-1 of the first unit pixel P1, the first green sub-pixel SPG-1 of the second unit pixel P2, and the first green sub-pixel SPG-1 of the third unit pixel P3 may not emit light, and the second green sub-pixel SPG-2 of the first unit pixel P1, the second green sub-pixel SPG-2 of the second unit pixel P2, and the second green sub-pixel SPG-2 of the third unit pixel P3 may emit light. Also, during the nth frame, the first blue sub-pixel SPB-1 of the first unit pixel P1, the first blue sub-pixel SPB-1 of the second unit pixel P2, and the first blue sub-pixel SPB-1 of the third unit pixel P3 may not emit light, and the second blue sub-pixel SPB-2 of the first unit pixel P1, the second blue sub-pixel SPB-2 of the second unit pixel P2, and the second blue sub-pixel SPB-2 of the third unit pixel P3 may emit light.

Referring to FIGS. 7 and 8C, an (n+1)th frame may be driven in the same manner as the (n−1)th frame. That is, during the (n+1)th frame, only the plurality of first red sub-pixels SPR-1 emit light and the plurality of second red sub-pixels SPR-2 may not emit light, among the plurality of red sub-pixels disposed in the plurality of unit pixels P. In addition, during the (n+1)th frame, only the plurality of first green sub-pixels SPG-1 may emit light and the plurality of second green sub-pixels SPG-2 may not emit light, among the plurality of green sub-pixels disposed in the plurality of unit pixels P. In addition, during the (n+1)th frame, only the plurality of first blue sub-pixels SPB-1 emit light and the plurality of second blue sub-pixels SPB-2 may not emit light, among the plurality of blue sub-pixels disposed in the plurality of unit pixels P.

Meanwhile, in a process of transferring an LED to a substrate during a manufacturing process of a light emitting display device, a defect in which the LED does not emit light normally may occur. LEDs can be formed in a micro unit, which is a small level. Accordingly, in a process of transferring the LED to a driving transistor array substrate, even a minute error may cause a defect in which poor contact between the LED and the driving transistor array substrate occurs. In particular, when a plurality of LEDs that fail to emit light are included in a specific area of the light emitting display device, a user can easily recognize the defect.

Accordingly, the inventors of the present disclosure have invented a light emitting display device having a new structure in preparation for LED transfer defects. Specifically, a plurality of LED elements are separately configured in unit pixels. Specifically, a first LED functioning as a main LED is used as a main light emitting element, and a second LED functioning as a redundancy LED may be configured to operate when a defect is caused in the first LED of a specific unit pixel. Accordingly, in preparation for LED defects, reliability of the light emitting display device can be improved.

However, the inventors of the present disclosure have recognized a limitation in that the second LED is not used at all when no defect occurs in the light emitting display device having a structure described above, thereby resulting in disadvantages in terms of a cost or process For example, the second LED is driven only when the first LED is determined to be defective. That is, when the first LED is normally driven, the second LED is not driven as the first LED is normally driven. Accordingly, a cost and process invested in the second LED of a high cost and a driving circuit for driving the second LED can be all recognized as waste.

Accordingly, in the light emitting display device 100 according to an embodiment of the present disclosure, two identical sub-pixels SP are alternately driven in one unit pixel P to thereby reduce waste in cost of the light emitting display device 100 and improve driving efficiency. That is, in the light emitting display device 100 according to an embodiment of the present disclosure, the unit pixel P is configured with the first LED 141 and the second LED 142 that emit light of the same color, and the data driver 120 applies a data voltage Vdata so that the first LED 141 and the second LED 142 can be alternately driven. For example, the first LEDs 141 emit light in an odd-numbered frame, and the second LEDs 142 emit light in an even-numbered frame. Therefore, even when the first LEDs 141 and the second LEDs 142 can emit light normally, both the plurality of first LEDs 141 and the plurality of second LEDs 142 can be driven, so that usability of the second LED 142 can be increased. Accordingly, since all the LEDs 140 disposed in the light emitting display device 100 are used, cost waste of the light emitting display device 100 can be reduced and driving efficiency can be improved.

In addition, in the light emitting display device 100 according to an embodiment of the present disclosure, a lifespan of the light emitting display device 100 can be improved. For example, in a conventional light emitting display device, only one LED of the first LED and the second LED that emit light of the same color in one unit pixel is used for light emission. That is, when a conventional light emitting display device is driven, a screen is displayed using only first LEDs among the first LEDs and second LEDs that emit light of the same color in one unit pixel, or the screen is displayed using only the second LEDs. On the other hand, in the light emitting display device 100 according to an embodiment of the present disclosure, the data driver 120 supplies a data voltage Vdata to the plurality of first LEDs 141 among the plurality of first LEDs 141 and the plurality of second LEDs 142 in the (n−1)th frame, and supplies a data voltage Vdata to the plurality of second LEDs 142 in the nth frame, so that each of the plurality of first LEDs 141 and the plurality of second LEDs 142 that are disposed in the plurality of unit pixels P emit light once over two frames. That is, in the odd-numbered frame, the first LEDs 141 among the first LEDs 141 and the second LEDs 142 emitting light of the same color may emit light, and in the even-numbered frame, the second LEDs 140 may emit light. Accordingly, compared to a case in which only one of the first LED 141 and the second LED 142 emitting light of the same color emits light continuously, a driving time of the LEDs 140 can be reduced by half. Accordingly, a time for each LED 140 to emit light while the light emitting display device 100 is being driven can be reduced, so that a lifespan of each of the plurality of LEDs 140 can be increased, and the lifespan of the light emitting display device 100 can be improved.

In addition, in the light emitting display device 100 according to an embodiment of the present disclosure, it is possible to prevent a step phenomenon in which a diagonal line is recognized as a stepped shape, and to improve a user's text recognition ability. In a conventional light emitting display device, a screen is displayed using only the first LEDs among the first LEDs and the second LEDs emitting light of the same color in one unit pixel, or the screen is displayed using only the second LEDs. Accordingly, since intervals between the LEDs are large, it may not be possible to implement a detailed image, and a user may recognize a text as being different from a text to be displayed. In particular, when a diagonal image is implemented, there occurred a step phenomenon in which a diagonal line is recognized as a stepped shape due to intervals between a plurality of LEDs formed in a row direction and a column direction. Accordingly, in the light emitting display device 100 according to an embodiment of the present disclosure, image distortion can be improved by alternately driving the plurality of first LEDs 141 and the plurality of second LEDs 142. That is, by reducing intervals between the plurality of light emitting LEDs 140, it is possible to prevent the step phenomenon and improve text recognition ability.

Also, in the light emitting display device 100 according to an embodiment of the present disclosure, a front of screen (FOS) can be improved. The FOS is a qualitative indicator, and may be defined as a degree of fullness of a screen felt by a viewer when the viewer watches an image on the screen of the light emitting display device. That is, as the number of sub-pixels constituting the screen in the same area increases, the FOS can be improved. In the light emitting display device 100 according to an embodiment of the present disclosure, although the plurality of first LEDs 141 and the plurality of second LEDs 142 are alternately driven in units of frames and both are driven to emit light, an interval between the frames is a very short time, so that a viewer can recognize both the plurality of first LEDs 141 and the plurality of second LEDs 142 that are alternately driven in units of frames as being driven, and thus the FOS can be improved.

Figure 9:
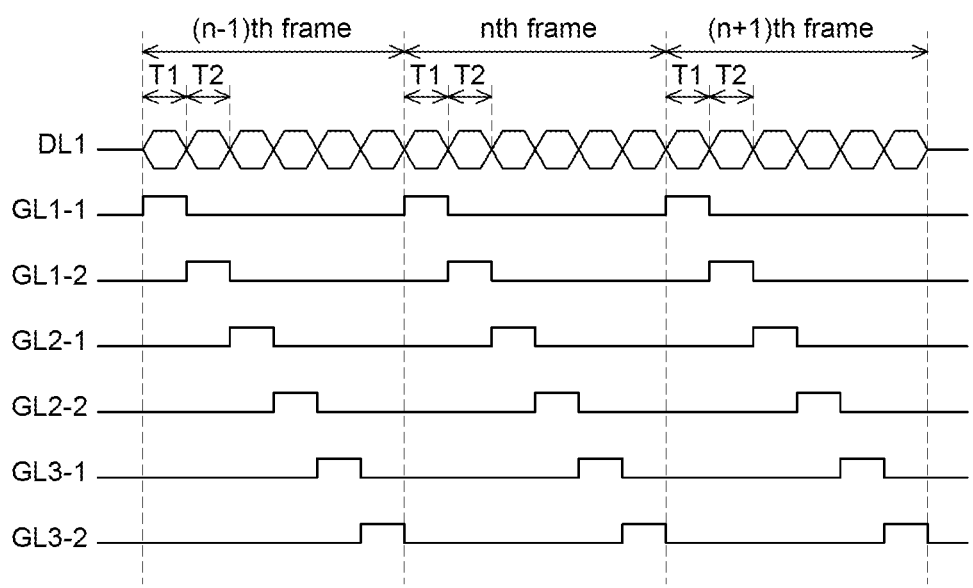
FIG. 9 is a waveform diagram illustrating a light emitting display device according to another embodiment of the present disclosure.
Figure 10:
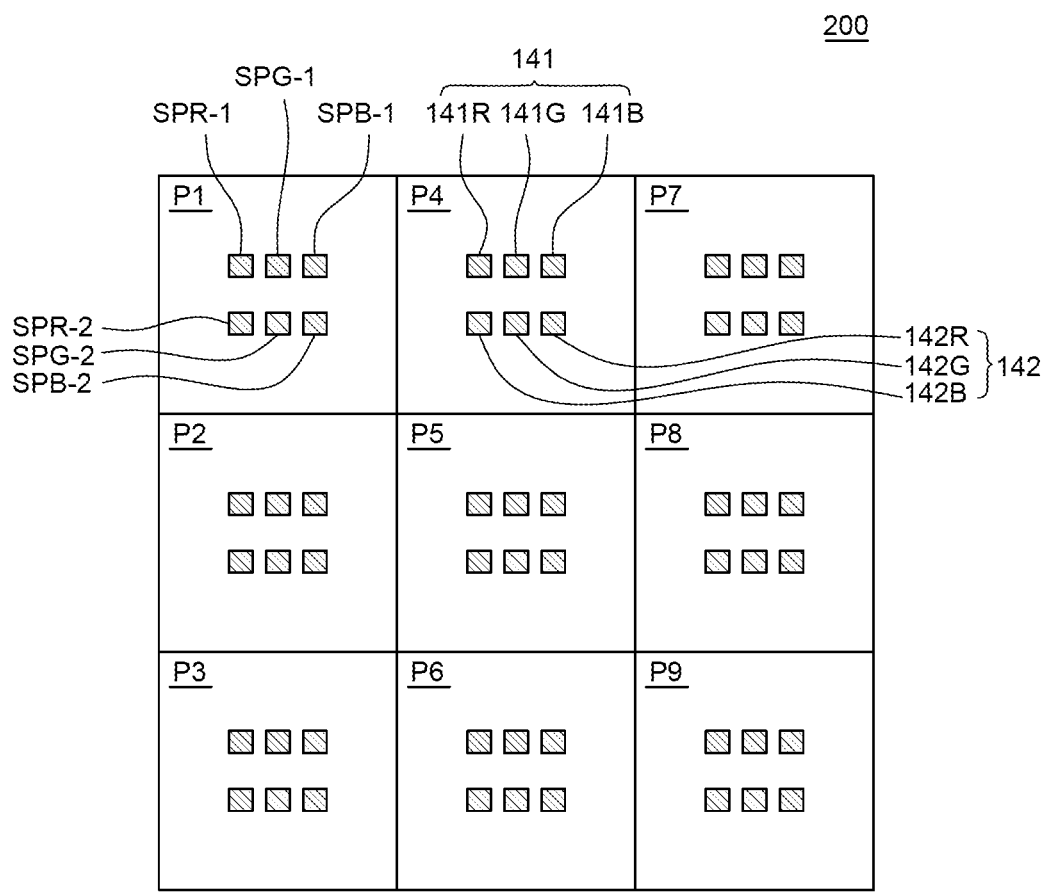
FIG. 10 is a plan view schematically illustrating a plurality of pixels of the light emitting display device according to another embodiment of the present disclosure, in units of frames.

FIG. 9 is a waveform diagram illustrating a light emitting display device according to another embodiment of the present disclosure. FIG. 10 is a plan view schematically illustrating a plurality of pixels of the light emitting display device according to another embodiment of the present disclosure, in units of frames. FIG. 9 schematically illustrates only data voltages Vdata and gate signals that are input during three frames for convenience of explanation. In FIG. 10, a first unit pixel P1, a second unit pixel P2, a third unit pixel P3, a fourth unit pixel P4, a fifth unit pixel P5, a sixth unit pixel P6, a seventh unit pixel P7, an eighth unit pixel P8, and a ninth unit pixel P9 that operate according to the waveform diagram of FIG. 9 are illustrated. In a light emitting display device 200 according to another embodiment of the present disclosure, since a driving method is the same for all frames, the plan view shown in FIG. 10 may be applied to all frames. In FIG. 10, hatching is illustrated in sub-pixels that emit light in each frame, and no hatching is illustrated in sub-pixels that do not emit light in each frame. The light emitting display device 200 of FIGS. 9 and 10 differs from the light emitting display device 100 of FIGS. 1 to 8C only in terms of the applied data voltage Vdata, and other configurations thereof are substantially the same and thus, shall be omitted.

Referring to FIGS. 9 and 10, in an (n−1)th frame, a gate high voltage is applied to the 1-1 gate line GL1-1 during a first period T1. Also, during the first period T1, a data voltage Vdata is applied to the first red sub-pixel SPR-1 of the first unit pixel P1 that is connected to the first data line DL1 and the 1-1 gate line GL1-1. Accordingly, the driving transistor DT of the first red sub-pixel SPR-1 of the first unit pixel P1 is turned on and thus, the first red sub-pixel SPR-1 of the first unit pixel P1 may emit light.

Subsequently, a gate high voltage is applied to the 1-2 gate line GL1-2 during a second period T2. In addition, during the second period T2, a data voltage Vdata is applied to the second red sub-pixel SPR-2 of the first unit pixel P1 that is connected to the first data line DL1 and the 1-2 gate line GL1-2. Accordingly, the driving transistor DT of the second red sub-pixel SPR-2 of the first unit pixel P1 is turned on and thus, the second red sub-pixel SPR-2 of the first unit pixel P1 may emit light.

The second unit pixel P2 and the third unit pixel P3 may be driven in the same manner as described above. That is, gate signals may be sequentially applied to the 2-1 gate line GL2-1, the 2-2 gate line GL2-2, the 3-1 gate line GL3-1, and the 3-2 gate line GL3-2, respectively, and a data voltage Vdata is applied to the first data line DL1 at a time at which a gate high voltage is applied to the 2-1 gate line GL2-1, the 2-2 gate line GL2-2, the 3-1 gate line GL3, and the 3-2 gate lines GL3-2, so that all of the first red sub-pixel SPR-1 and the second red sub-pixel SPR-2 of the second unit pixel P2 and the first red sub-pixel SPR-1 and the second red sub-pixel SPR-2 of the third unit pixel P3 may emit light.

Accordingly, all of the plurality of red sub-pixels disposed in the plurality of unit pixels P may emit light during the (n−1)th frame.

Also, the plurality of green sub-pixels and the plurality of blue sub-pixels disposed in the plurality of unit pixels P may be driven in the same manner. Accordingly, during the (n−1)th frame, all of the first green sub-pixel SPG-1 and the second green sub-pixel SPG-2 of the first unit pixel P1, the first green sub-pixel SPG-1 and the second green sub-pixel SPG-2 of the second unit pixel P2, and the first green sub-pixel SPG-1 and the second green sub-pixel SPG-2 of the third unit pixel P3 may emit light. In addition, during the (n−1)th frame, all of the first blue sub-pixel SPB-1 and the second blue sub-pixel SPB-2 of the first unit pixel P1, the first blue sub-pixel SPB-1 and the second blue sub-pixel SPB-2 of the second unit pixel P2, and the first blue sub-pixel SPB-1 and the second blue sub-pixel SPB-2 of the third unit pixel P3 may emit light.

Subsequently, referring to FIGS. 9 and 10, a data voltage Vdata may be applied to an nth frame and an (n+1)th frame in the same manner as the (n−1)th frame. Accordingly, even in the nth frame and the (n+1)th frame, all of the first red sub-pixel SPR-1 and the second red sub-pixel SPR-2 of the first unit pixel P1, the first red sub-pixel SPR-1 and the second red sub-pixel SPR-2 of the second unit pixel P2, and the first red sub-pixel SPR-1 and the second red sub-pixel SPR-2 of the third unit pixel P3 may emit light. Also, even in the nth frame and the (n+1)th frame, all of the first green sub-pixel SPG-1 and the second green sub-pixel SPG-2 of the first unit pixel P1, the first green sub-pixel SPG-1 and the second green sub-pixel SPG-2 of the second unit pixel P2, and the first green sub-pixel SPG-1 and the second green sub-pixel SPG-2 of the third unit pixel P3 may emit light. Also, even in the nth frame and the (n+1)th frame, all of the first blue sub-pixel SPB-1 and the second blue sub-pixel SPB-2 of the first unit pixel P1, the first blue sub-pixel SPB-1 and the second blue sub-pixel SPB-2 of the second unit pixel P2, and the first blue sub-pixel SPB-1 and the second blue sub-pixel SPB-2 of the third unit pixel P3 may emit light.

In the light emitting display device 200 according to another embodiment of the present disclosure, when the first LED 141 and the second LED 142 can emit light normally, the data driver 120 applies a data voltage Vdata so that the first LED 141 and the second LED 142 can be driven alternately. Accordingly, since all the LEDs 140 disposed in the light emitting display device 200 are used, cost waste of the light emitting display device 200 can be reduced and driving efficiency can be improved.

In addition, in the light emitting display device 200 according to another embodiment of the present disclosure, image distortion can be improved by alternately driving the plurality of first LEDs 141 and the plurality of second LEDs 142. That is, by reducing intervals between the plurality of LEDs 140 emitting light, a step phenomenon can be prevented, text recognition ability can be improved, and FOS can be improved.

In addition, in the light emitting display device 200 according to another embodiment of the present disclosure, the plurality of first LEDs 141 and the plurality of second LEDs 142 that are disposed in two lines sequentially emit light within one frame, so that a driving frequency and resolution recognized by a user may be increased. That is, in the light emitting display device 200 according to another embodiment of the present disclosure, since both the first LED 141 and the second LED 142 emit light in the unit pixel P during one frame, the number of sub-pixels SP that implement an image in one frame may be increased. Accordingly, in the light emitting display device 200 according to another embodiment of the present disclosure, a driving frequency and resolution actually recognized by a user can be increased without changes in circuits for driving the sub-pixels SP or a driving frequency actually applied.

Figure 11:
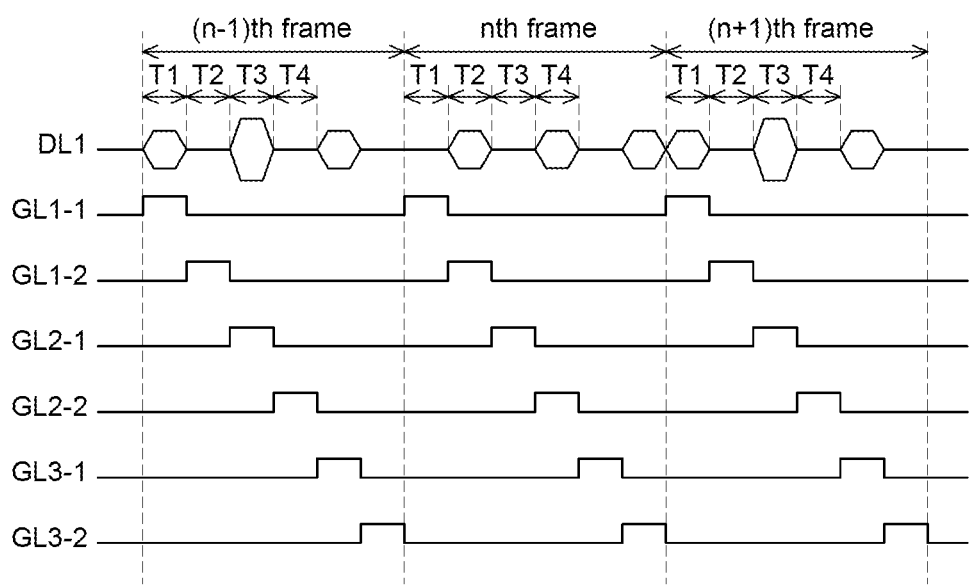
FIG. 11 is a waveform diagram illustrating a light emitting display device according to still another embodiment of the present disclosure.
Figure 12A:
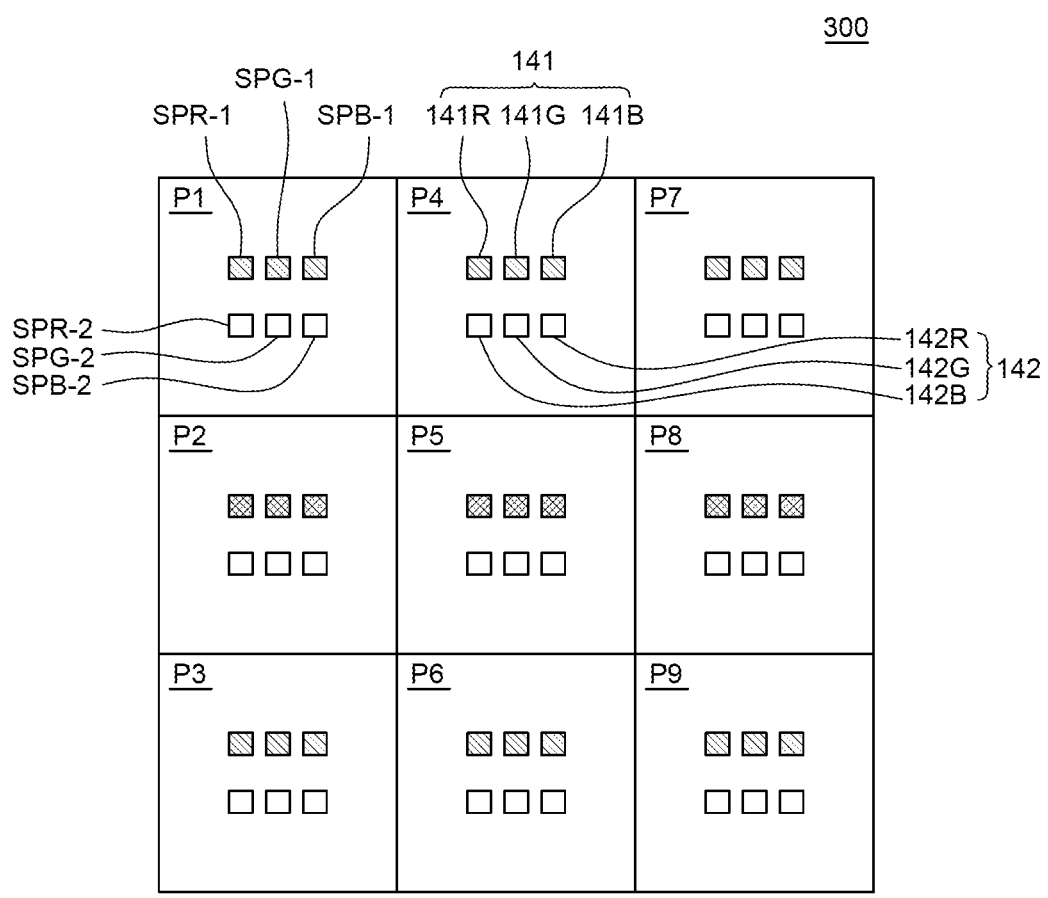
FIGS. 12A to 12C are plan views schematically illustrating a plurality of pixels of the light emitting display device according to still another embodiment of the present disclosure, in units of frames.
Figure 12B:
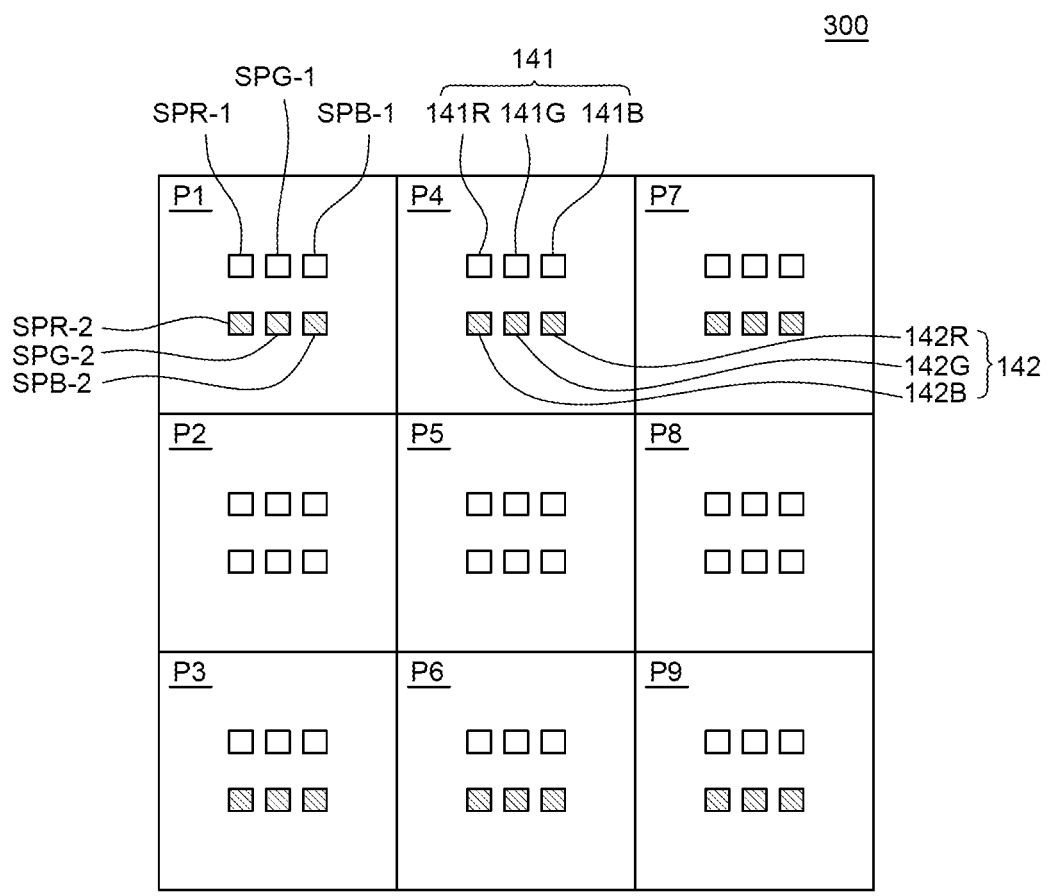
Figure 12C:
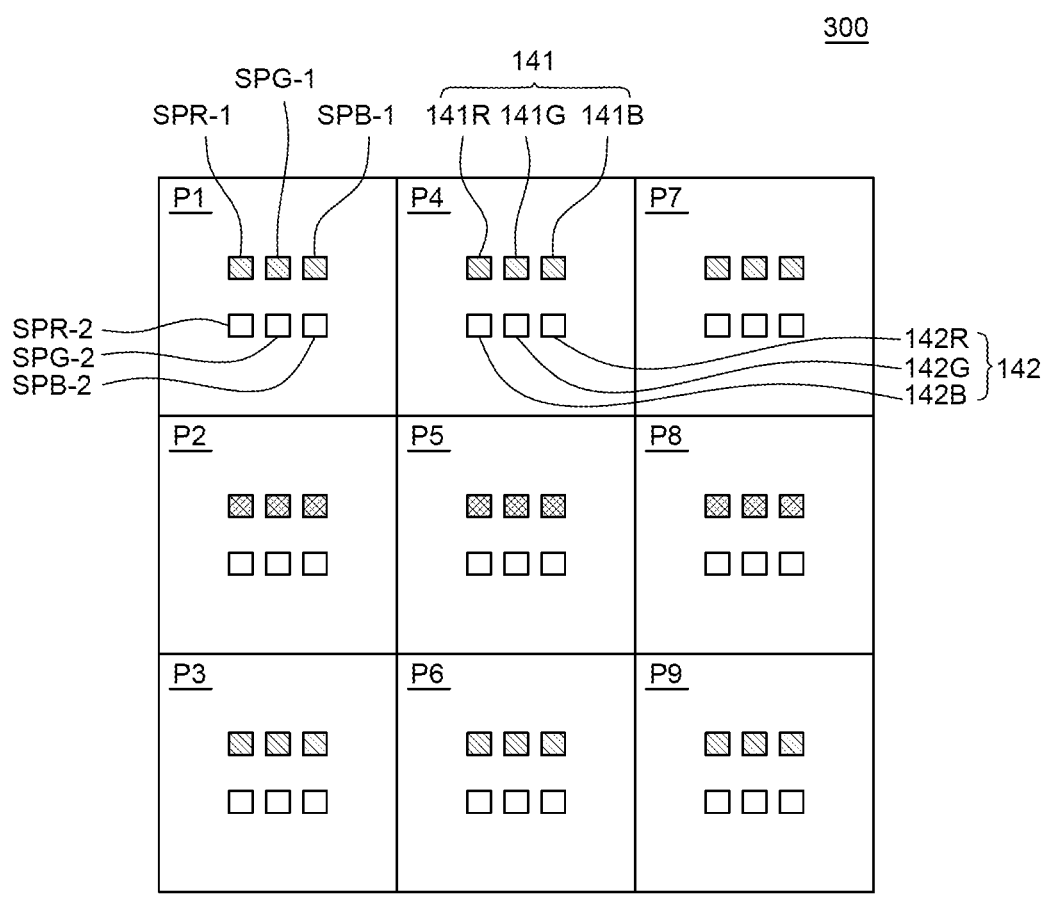

FIG. 11 is a waveform diagram illustrating a light emitting display device according to still another embodiment of the present disclosure. FIGS. 12A to 12C are plan views schematically illustrating a plurality of pixels of the light emitting display device according to still another embodiment of the present disclosure, in units of frames. FIG. 11 schematically illustrates only data voltages Vdata and gate signals that are input during three frames for convenience of explanation. In FIGS. 12A to 12C, a first unit pixel P1, a second unit pixel P2, a third unit pixel P3, a fourth unit pixel P4, a fifth unit pixel P5, a sixth unit pixel P6, a seventh unit pixel P7, an eighth unit pixel P8, and a ninth unit pixel P9 that operate according to the waveform diagram of FIG. 11 are illustrated, in units of frames. In FIGS. 12A to 12C, diagonal hatching is shown in sub-pixels that generally emit light in each frame, X-hatching is shown in sub-pixels that emit light for luminance compensation in each frame, and no hatching is shown in sub-pixels that do not emit light in each frame. In a light emitting display device 300 according to still another embodiment of the present disclosure, it is assumed that there occurred a horizontal dark line defect in which all the second LEDs 142 of the second unit pixel P2, the fifth unit pixel P5, and the eighth unit pixel P8 that are unit pixels disposed in the second row are not driven. The light emitting display device 300 of FIGS. 11 to 12C differs from the light emitting display device 100 of FIGS. 1 to 8C only in the applied data voltage Vdata, and other configurations thereof are substantially the same and thus, shall be omitted.

Referring to FIGS. 11 and 12A, in the (n−1)th frame, a gate high voltage is applied to the 1-1 gate line GL1-1 during a first period T1. Also, during the first period T1, a data voltage Vdata is applied to the first red sub-pixel SPR-1 of the first unit pixel P1 that is connected to the first data line DL1 and the 1-1 gate line GL1-1. Accordingly, the driving transistor DT of the first red sub-pixel SPR-1 of the first unit pixel P1 is turned on and thus, the first red sub-pixel SPR-1 of the first unit pixel P1 may emit light.

Subsequently, a gate high voltage is applied to the 1-2 gate line GL1-2 during a second period T2. However, in the second period T2, a data voltage Vdata may not be applied to the first data line DL1 or a data voltage Vdata having a lowest value such as a ground voltage may be applied thereto. Accordingly, the driving transistor DT of the second red sub-pixel SPR-2 of the first unit pixel P1 is turned off and thus, the second red sub-pixel SPR-2 of the first unit pixel P1 may not emit light.

Subsequently, a gate high voltage is applied to the 2-1 gate line GL2-1 during a third period T3. Also, during the third period T3, a data voltage Vdata is applied to the first red sub-pixel SPR-1 of the second unit pixel P2 that is connected to the first data line DL1 and the 2-1 gate line GL2-1. At this time, as described above, the second red sub-pixels SPR-2, the second green sub-pixels SPG-2 and the second blue sub-pixels SPB-2 of the second unit pixel P2, the fifth unit pixel P5, and the eighth unit pixel P8, that are sub-pixels connected to the 2-2 gate line GL2-2 fail to emit light. Accordingly, in order to prevent a decrease in luminance that may be caused because the second red sub-pixels SPR-2, the second green sub-pixels SPG-2, and the second blue sub-pixels SPB-2 of the second unit pixel P2, the fifth unit pixel P5, and the eighth unit pixel P8 fail to emit light, a data voltage Vdata which is increased compared to a data voltage Vdata that needs to be normally applied is applied to the first data line DL1 during the third period T3, so it can be driven brighter. For example, the data voltage Vdata applied to the first data line DL1 during the third period T3 may be twice the data voltage Vdata that needs to be normally applied. Accordingly, the driving transistor DT of the first red sub-pixel SPR-1 of the second unit pixel P2 is turned on and thus, the first red sub-pixel SPR-1 of the second unit pixel P2 can emit light with double brightness.

Subsequently, a gate high voltage is applied to the 2-2 gate line GL2-2 during a fourth period T4. However, as described above, defects occur in the second red sub-pixels SPR-2, the second green sub-pixels SPG-2, and the second blue sub-pixels SPB-2 of the second unit pixel P2, the fifth unit pixel P5, and the eighth unit pixel P8, that are sub-pixels connected to the 2-2 gate line GL2-2, so that the second red sub-pixel SPR-2 of the second unit pixel P2 may not emit light. Also, in the fourth period T4, a data voltage Vdata is not applied to the first data line DL1 or a data voltage Vdata of a lowest value such as a ground voltage is applied thereto, so that the driving transistor DT of the second red sub-pixel SPR-2 of the second unit pixel P2 is turned off and thus, the second red sub-pixel SPR-2 of the second unit pixel P2 may not emit light.

The third unit pixel P3 may also be driven in the same manner as the first unit pixel P1. That is, gate signals are sequentially supplied to the 3-1 gate line GL3-1 and the 3-2 gate line GL3-2, respectively, and a data voltage Vdata is applied to the first data line DL1 at a time at which a gate high voltage is applied to the 3-1 gate line GL3-1, so that the first red sub-pixel SPR-1 of the third unit pixel P3 may emit light and the second red sub-pixel SPR-2 of the third unit pixel P3 may not emit light.

Also, the plurality of green sub-pixels and the plurality of blue sub-pixels disposed in the plurality of unit pixels P may be driven in the same manner. Accordingly, during the (n−1)th frame, the first green sub-pixel SPG-1 of the first unit pixel P1 and the first green sub-pixel SPG-1 of the third unit pixel P3 emit light, and the second green sub-pixel SPG-2 of the first unit pixel P1 and the second green sub-pixel SPG-2 of the third unit pixel P3 may not emit light. Meanwhile, the first green sub-pixel SPG-1 of the second unit pixel P2 may emit light with increased brightness, and the second green sub-pixel SPG-2 of the second unit pixel P2 may not emit light due to a defect and by a driving signal. Also, during the (n−1)th frame, the first blue sub-pixel SPB-1 of the first unit pixel P1 and the first blue sub-pixel SPB-1 of the third unit pixel P3 may emit light, and the second blue sub-pixel SPB-2 of the first unit pixel P1 and the second blue sub-pixel SPB-2 of the third unit pixel P3 may not emit light. Also, the first blue sub-pixel SPB-1 of the second unit pixel P2 may emit light with increased brightness, and the second blue sub-pixel SPB-2 of the second unit pixel P2 may not emit light due to a defect and by a driving signal.

Subsequently, referring to FIGS. 11 and 12B, in an nth frame, a gate high voltage is applied to the 1-1 gate line GL1-1 during a first period T1. However, in the first period T1, a data voltage Vdata may not be applied to the first data line DL1 or a data voltage Vdata having a lowest value such as a ground voltage may be applied thereto. Accordingly, the driving transistor DT of the first red sub-pixel SPR-1 of the first unit pixel P1 is turned off and thus, the first red sub-pixel SPR-1 of the first unit pixel P1 may not emit light.

Subsequently, a gate high voltage is applied to the 1-2 gate line GL1-2 during a second period T2. In addition, during the second period T2, a data voltage Vdata is applied to the second red sub-pixel SPR-2 of the first unit pixel P1 that is connected to the first data line DL1 and the 1-2 gate line GL1-2. Accordingly, the driving transistor DT of the second red sub-pixel SPR-2 of the first unit pixel P1 is turned on and thus, the second red sub-pixel SPR-2 of the first unit pixel P1 may emit light.

Subsequently, a gate high voltage is applied to the 2-1 gate line GL2-1 during a third period T3. However, in the third period T3, a data voltage Vdata may not be applied to the first data line DL1 or a data voltage Vdata having a lowest value such as a ground voltage may be applied thereto. Accordingly, the driving transistor DT of the first red sub-pixel SPR-1 of the second unit pixel P2 is turned off and thus, the first red sub-pixel SPR-1 of the second unit pixel P2 does not emit light.

Subsequently, a gate high voltage is applied to the 2-2 gate line GL2-2 during a fourth period T4. Also, during the fourth period T4, a data voltage Vdata is applied to the second red sub-pixel SPR-2 of the second unit pixel P2 that is connected to the first data line DL1 and the 2-2 gate line GL2-2. However, as described above, since a defect is assumed in which the second red sub-pixels SPR-2, the second green sub-pixels SPG-2, and the second blue sub-pixels SPB-2 of the second unit pixel P2, the fifth unit pixel P5, and the eighth unit pixel P8, that are sub-pixels connected to the 2-2 gate line GL2-2 fail to emit light, the second red sub-pixel SPR-2 of the second unit pixel P2 does not emit light.

The third unit pixel P3 may also be driven in the same manner as described above. That is, gate signals may be sequentially applied to the 3-1 gate line GL3-1 and the 3-2 gate line GL3-2, respectively, and a data voltage Vdata is applied to the first data line DL1 at a time at which a gate high voltage is applied to the 3-2 gate line GL3-2, so that the first red sub-pixel SPR-1 of the third unit pixel P3 may not emit light and the second red sub-pixel SPR-2 of the third unit pixel P3 may emit light.

Also, the plurality of green sub-pixels and the plurality of blue sub-pixels disposed in the plurality of unit pixels P may be driven in the same manner. Accordingly, during the nth frame, the first green sub-pixel SPG-1 of the first unit pixel P1, the first green sub-pixel SPG-1 of the second unit pixel P2, and the first green sub-pixel SPG-1 of the third unit pixel P3 may not emit light, and the second green sub-pixel SPG-2 of the first unit pixel P1, the second green sub-pixel SPG-2 of the second unit pixel P2, and the second green sub-pixel SPG-2 of the third unit pixel P3 may emit light. Meanwhile, the second green sub-pixel SPG-2 of the second unit pixel P2 may not emit light due to a defect and by a driving signal. Also, during the nth frame, the first blue sub-pixel SPB-1 of the first unit pixel P1, the first blue sub-pixel SPB-1 of the second unit pixel P2, and the first blue sub-pixel SPB-1 of the third unit pixel P3 may not emit light, and the second blue sub-pixel SPB-2 of the first unit pixel P1 and the second blue sub-pixel SPB-2 of the third unit pixel P3 may emit light. Meanwhile, the second blue sub-pixel SPB-2 of the second unit pixel P2 may not emit light due to a defect and by a driving signal.

Referring to FIGS. 11 and 12C, an (n+1)th frame may be driven in the same manner as the (n−1)th frame. That is, during the (n+1)th frame, the first red sub-pixel SPR-1 of the first unit pixel P1 and the first red sub-pixel SPR-1 of the third unit pixel P3 may emit light, the second red sub-pixel SPR-2 of the first unit pixel P1 and the second red sub-pixel SPR-2 of the third unit pixel P3 may not emit light, the first red sub-pixel SPR-1 of the second unit pixel P2 may emit light with increased brightness, and the second red sub-pixel SPR-2 of the second unit pixel P2 may not emit light due to a defect and by a driving signal. Also, during the (n+1)th frame, the first green sub-pixel SPG-1 of the first unit pixel P1 and the first green sub-pixel SPG-1 of the third unit pixel P3 may emit light, the second green sub-pixel SPG-2 of the first unit pixel P1 and the second green sub-pixel SPG-2 of the third unit pixel P3 may not emit light, the first green sub-pixel SPG-1 of the second unit pixel P2 may emit light with increased brightness, and the second green sub-pixel SPG-2 of the second unit pixel P2 may not emit light due to a defect and by a driving signal. Also, during the (n+1)th frame, the first blue sub-pixel SPB-1 of the first unit pixel P1 and the first blue sub-pixel SPB-1 of the third unit pixel P3 may emit light, the second blue sub-pixel SPB-2 of the first unit pixel P1 and the second blue sub-pixel SPB-2 of the third unit pixel P3 may not emit light, the first blue sub-pixel SPB-1 of the second unit pixel P2 may emit light with increased brightness, and the second blue sub-pixel SPB-2 of the second unit pixel P2 may not emit light due to a defect and by a driving signal.

In FIGS. 11 to 12C, it is assumed a case where there occurred a horizontal dark line defect in which all the second LEDs 142 of the second unit pixel P2, the fifth unit pixel P5, and the eighth unit pixel P8 that are unit pixels disposed in the second row are not driven, but the present disclosure is not limited thereto, and a case where a plurality of LEDs 140 disposed in different row directions are defective or a case where some of the plurality of LEDs 140 disposed in a row direction are defective may also be applied to the light emitting display device 300 according to still another embodiment of the present disclosure. That is, in FIGS. 11 to 12C, only the case where the plurality of second LEDs 142 are defective is assumed, but when the first LED 141 is defective or a circuit or line for driving the first LED 141 is defective, for example, when the first LED 141 is not accurately transferred and thus, the first LED 141 abnormally emits light or cannot emit light, or when a circuit or line for driving the first LED 141 is not properly formed in a manufacturing process, the data driver 120 may apply a data voltage Vdata, which is increased compared to a case where light is normally emitted, to the second LED 142. In addition, when only one second LED 142 among the plurality of second LEDs 142 disposed in one row is defective or a circuit or line for driving the corresponding second LED 142 is defective, the data driver 120 may apply the increased data voltage Vdata only to the first LED 141 corresponding to the corresponding second LED 142, rather than an entirety of those in the corresponding row.

In the light emitting display device 300 according to still another embodiment of the present disclosure, when the first LED 141 and the second LED 142 can emit light normally, the data driver 120 applies a data voltage Vdata so that the first LED 141 and the second LED 142 can be driven alternately. Accordingly, since all the LEDs 140 disposed in the light emitting display device 300 are used, cost waste of the light emitting display device 300 can be reduced and driving efficiency can be improved.

In addition, in the light emitting display device 300 according to still another embodiment of the present disclosure, a lifespan of the light emitting display device 300 may be improved. That is, in an odd-numbered frame, the first LEDs 141 among the first LEDs 141 and the second LEDs 142 that emit light of the same color may emit light, and in an even-numbered frame, the second LEDs 142 may emit light. Accordingly, compared to a case in which only one of the first LED 141 and the second LED 142 emitting light of the same color emits light continuously, a driving time of the LEDs 140 can be reduced by half. Accordingly, a time for each LED 140 to emit light while the light emitting display device 300 is being driven can be reduced, so that the lifespan of each of the plurality of LEDs 140 can be increased, and the lifespan of the light emitting display device 300 can be improved.

In addition, in the light emitting display device 300 according to still another embodiment of the present disclosure, image distortion can be improved by alternately driving the plurality of first LEDs 141 and the plurality of second LEDs 142. That is, by reducing intervals between the plurality of light emitting LEDs 140, a step phenomenon can be prevented, text recognition ability can be improved, and FOS can be improved.

In addition, in the light emitting display device 300 according to still another embodiment of the present disclosure, when a defective pixel or dark line is caused, it is possible to prevent the defective pixel or dark line from being recognized by a user. For example, when a plurality of LEDs that fail to emit light are included in a specific area of the light emitting display device, a viewer may recognize dark spots and dark lines of the display device due to differences in luminance. Accordingly, in the light emitting display device 300 according to still another embodiment of the present disclosure, when one of the first LED 141 and the second LED 142 abnormally emits light or cannot emit light, it is possible to prevent a user from recognizing dark lines or dark spots by driving the other with brightness which is more increased than when light can be emitted normally.

Figure 13:
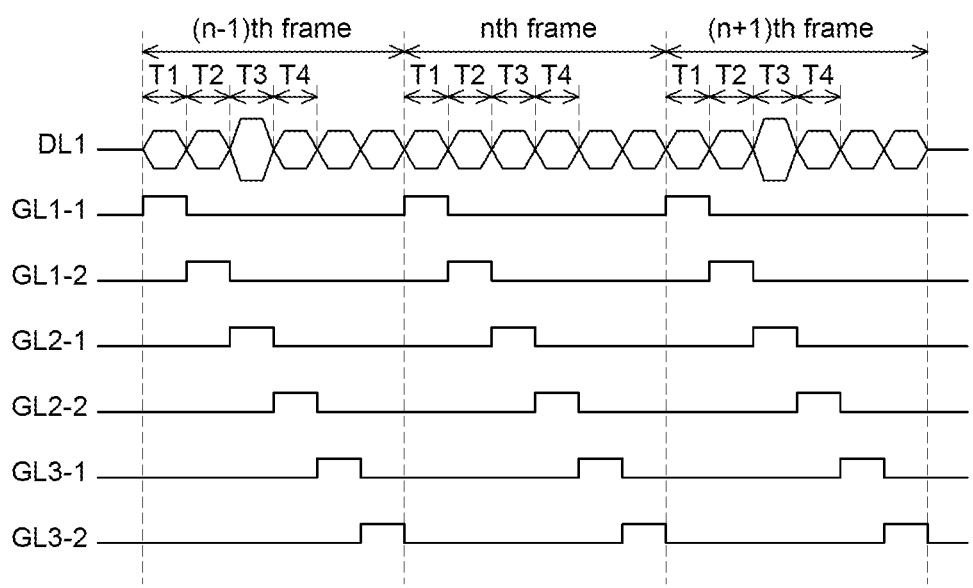
FIG. 13 is a waveform diagram illustrating a light emitting display device according to yet another embodiment of the present disclosure.
Figure 14:
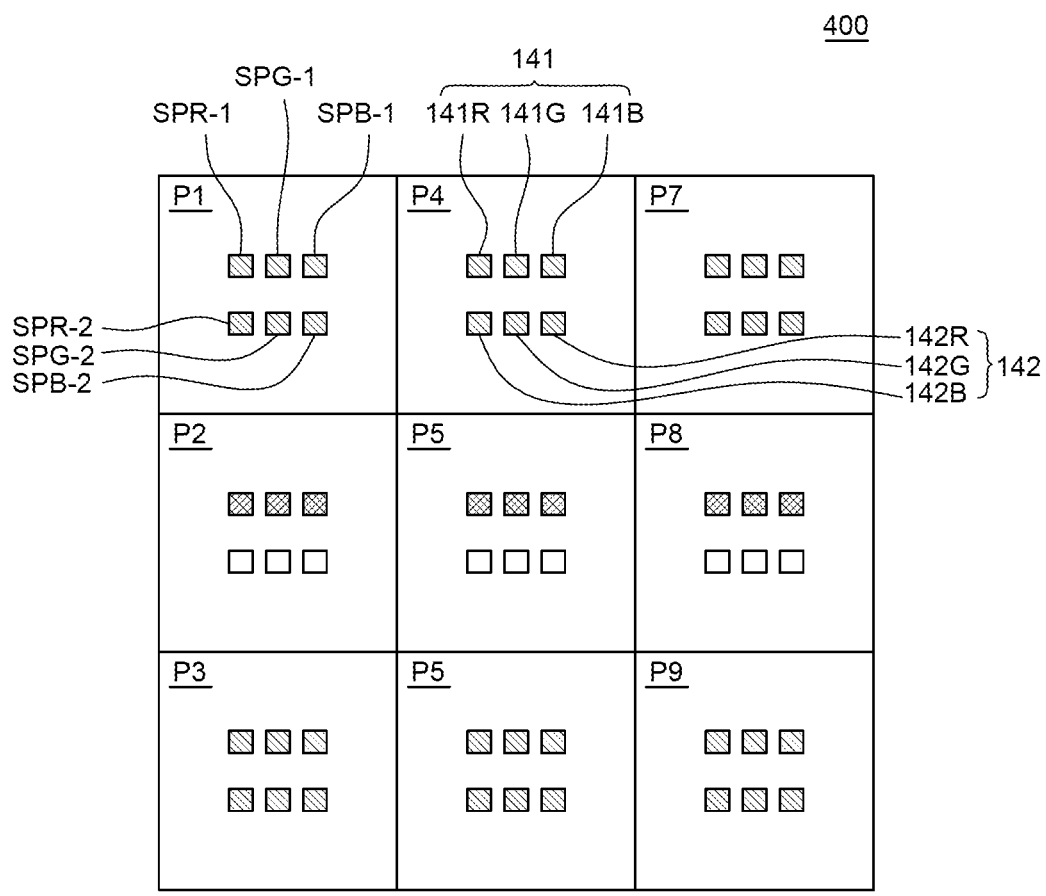
FIG. 14 is a plan view schematically illustrating a plurality of pixels of the light emitting display device according to yet another embodiment of the present disclosure, in units of frames.

FIG. 13 is a waveform diagram illustrating a light emitting display device according to yet another embodiment of the present disclosure. FIG. 14 is a plan view schematically illustrating a plurality of pixels of the light emitting display device according to yet another embodiment of the present disclosure, in units of frames. FIG. 13 schematically illustrates only data voltages Vdata and gate signals that are input during three frames for convenience of explanation. In FIG. 14, a first unit pixel P1, a second unit pixel P2, a third unit pixel P3, a fourth unit pixel P4, a fifth unit pixel P5, a sixth unit pixel P6, a seventh unit pixel P7, an eighth unit pixel P8, and a ninth unit pixel P9 that operate according to the waveform diagram of FIG. 13 are illustrated. In a light emitting display device 400 according to yet another embodiment of the present disclosure, since a driving method is the same for all frames, the plan view shown in FIG. 14 may be applied to all frames. In FIG. 14, hatching is illustrated in sub-pixels that emit light in each frame and no hatching is illustrated in sub-pixels that do not emit light in each frame. In FIG. 14, diagonal hatching is shown in sub-pixels that generally emit light in each frame and X-hatching is shown in sub-pixels that emit light for luminance compensation in each frame. In the light emitting display device 400 according to yet another embodiment of the present disclosure, it is assumed that there occurred a horizontal dark line defect in which all the second LEDs of the second unit pixel P2, the fifth unit pixel P5, and the eighth unit pixel P8 that are unit pixels disposed in the second row are not driven. The light emitting display device 400 of FIGS. 13 to 14 differs from the light emitting display device 100 of FIGS. 1 to 8C only in the applied data voltage Vdata, and other configurations thereof are substantially the same and thus, shall be omitted.

Referring to FIGS. 13 to 14, in an (n−1)th frame, a gate high voltage is applied to the 1-1 gate line GL1-1 during a first period T1. Also, during the first period T1, a data voltage Vdata is applied to the first red sub-pixel SPR-1 of the first unit pixel P1 that is connected to the first data line DL1 and the 1-1 gate line GL1-1. Accordingly, the driving transistor DT of the first red sub-pixel SPR-1 of the first unit pixel P1 is turned on and thus, the first red sub-pixel SPR-1 of the first unit pixel P1 may emit light.

Subsequently, a gate high voltage is applied to the 1-2 gate line GL1-2 during a second period T2. In addition, during the second period T2, a data voltage Vdata is applied to the second red sub-pixel SPR-2 of the first unit pixel P1 that is connected to the first data line DL1 and the 1-2 gate line GL1-2. Accordingly, the driving transistor DT of the second red sub-pixel SPR-2 of the first unit pixel P1 is turned on and thus, the second red sub-pixel SPR-2 of the first unit pixel P1 may emit light.

Subsequently, a gate high voltage is applied to the 2-1 gate line GL2-1 during a third period T3. Also, during the third period T3, a data voltage Vdata is applied to the first red sub-pixel SPR-1 of the second unit pixel P2 that is connected to the first data line DL1 and the 2-1 gate line GL2-1. At this time, as described above, the second red sub-pixels SPR-2, the second green sub-pixels SPG-2 and the second blue sub-pixels SPB-2 of the second unit pixel P2, the fifth unit pixel P5, and the eighth unit pixel P8, that are sub-pixels connected to the 2-2 gate line GL2-2 fail to emit light. Accordingly, in order to prevent a decrease in luminance that may be caused because the second red sub-pixels SPR-2, the second green sub-pixels SPG-2, and the second blue sub-pixels SPB-2 of the second unit pixel P2, the fifth unit pixel P5, and the eighth unit pixel P8 fail to emit light, a data voltage Vdata which is increased compared to a data voltage Vdata that needs to be normally applied may be applied to the first data line DL1 during the third period T3. For example, the data voltage Vdata applied to the first data line DL1 during the third period T3 may be twice the data voltage Vdata that needs to be normally applied. Accordingly, the driving transistor DT of the first red sub-pixel SPR-1 of the second unit pixel P2 is turned on and thus, the first red sub-pixel SPR-1 of the second unit pixel P2 can emit light with double brightness.

Subsequently, a gate high voltage is applied to the 2-2 gate line GL2-2 during a fourth period T4. Also, during the fourth period T4, a data voltage Vdata is applied to the second red sub-pixel SPR-2 of the second unit pixel P2 that is connected to the first data line DL1 and the 2-2 gate line GL2-2. However, as described above, since a defect is assumed in which the second red sub-pixels SPR-2, the second green sub-pixels SPG-2, and the second blue sub-pixels SPB-2 of the second unit pixel P2, the fifth unit pixel P5, and the eighth unit pixel P8, that are sub-pixels connected to the 2-2 gate line GL2-2 fail to emit light, the second red sub-pixel SPR-2 of the second unit pixel P2 does not emit light.

The third unit pixel P3 may also be driven in the same manner as the first unit pixel P1. That is, gate signals are sequentially supplied to the 3-1 gate line GL3-1 and the 3-2 gate line GL3-2, respectively, and a data voltage Vdata is applied to the first data line DL1 at a time at which a gate high voltage is applied to the 3-1 gate line GL3-1 and the 3-2 gate line GL3-2, so that all of the first red sub-pixel SPR-1 and the second red sub-pixel SPR-2 of the third unit pixel P3 may emit light.

Also, the plurality of green sub-pixels and the plurality of blue sub-pixels disposed in the plurality of unit pixels P may be driven in the same manner. Accordingly, during the (n−1)th frame, the first green sub-pixel SPG-1 and the second green sub-pixel SPG-2 of the first unit pixel P1 and the first green sub-pixel SPG-1 and the second green sub-pixel SPG-2 of the third unit pixel P3 may emit light. Meanwhile, the first green sub-pixel SPG-1 of the second unit pixel P2 may emit light with increased brightness, and the second green sub-pixel SPG-2 of the second unit pixel P2 may not emit light due to a defect and by a driving signal. Also, during the (n−1)th frame, the first blue sub-pixel SPB-1 and the second blue sub-pixel SPB-2 of the first unit pixel P1 and the first blue sub-pixel SPB-1 and the second blue sub-pixel SPB-2 of the third unit pixel P3 may emit light. In addition, the first blue sub-pixel SPB-1 of the second unit pixel P2 may emit light with increased brightness, and the second blue sub-pixel SPB-2 of the second unit pixel P2 may not emit light due to a defect and by a driving signal.

Subsequently, referring to FIGS. 13 and 14, a data voltage Vdata may be applied to an nth frame and an (n+1)th frame in the same manner as the (n−1)th frame. Accordingly, even in the nth frame and the (n+1)th frame, the first red sub-pixel SPR-1 and the second red sub-pixel SPR-2 of the first unit pixel P1 and the first red sub-pixel SPR-1 and the second red sub-pixel SPR-2 of the third unit pixel P3 may emit light. Meanwhile, the first red sub-pixel SPR-1 of the second unit pixel P2 may emit light with increased brightness, and the second red sub-pixel SPR-2 of the second unit pixel P2 may not emit due to a defect and by a driving signal. Also, even in the nth frame and the (n+1)th frame, the first green sub-pixel SPG-1 and the second green sub-pixel SPG-2 of the first unit pixel P1 and the first green sub-pixel SPG-1 and the second green sub-pixel SPG-2 of the third unit pixel P3 may emit light. Meanwhile, the first green sub-pixel SPG-1 of the second unit pixel P2 may emit light with increased brightness, and the second green sub-pixel SPG-2 of the second unit pixel P2 may not emit light due to a defect or by a driving signal. Also, even in the nth frame and the (n+1)th frame, the first blue sub-pixel SPB-1 and the second blue sub-pixel SPB-2 of the first unit pixel P1 and the first blue sub-pixel SPB-1 and the second blue sub-pixel SPB-2 of the third unit pixel P3 may emit light. In addition, the first blue sub-pixel SPB-1 of the second unit pixel P2 may emit light with increased brightness, and the second blue sub-pixel SPB-2 of the second unit pixel P2 may not emit light due to a defect and by a driving signal.

In FIGS. 13 and 14, it is assumed a case where there occurred a horizontal dark line defect in which all the second LEDs 142 of the second unit pixel P2, the fifth unit pixel P5, and the eighth unit pixel P8 that are unit pixels disposed in the second row are not driven, but the present disclosure is not limited thereto, and a case where a plurality of LEDs 140 disposed in different row directions are defective or a case where some of the plurality of LEDs 140 disposed in a row direction are defective may also be applied to the light emitting display device 400 according to yet another embodiment of the present disclosure. That is, in FIGS. 13 and 14, only the case where the plurality of second LEDs 142 are defective is assumed, but when the first LED 141 is defective or a circuit or line for driving the first LED 141 is defective, the data driver 120 may apply a data voltage Vdata, which is increased compared to a case where light is normally emitted, to the second LED 142. In addition, when only one second LED 142 among the plurality of second LEDs 142 disposed in one row is defective or a circuit or line for driving the corresponding second LED 142 is defective, the data driver 120 may apply the increased data voltage Vdata only to the first LED 141 corresponding to the corresponding second LED 142, rather than an entirety of those in the corresponding row.

In the light emitting display device 400 according to yet another embodiment of the present disclosure, when the first LED 141 and the second LED 142 can emit light normally, the data driver 120 applies a data voltage Vdata so that the first LED 141 and the second LED 142 can be driven alternately. Accordingly, since all the LEDs 140 disposed in the light emitting display device 400 are used, cost waste of the light emitting display device 400 can be reduced and driving efficiency can be improved.

In addition, in the light emitting display device 400 according to yet another embodiment of the present disclosure, a lifespan of the light emitting display device 400 may be improved. That is, in an odd-numbered frame, the first LEDs 141 among the first LEDs 141 and the second LEDs 142 that emit light of the same color may emit light, and in an even-numbered frame, the second LEDs 142 may emit light. Accordingly, compared to a case in which only one of the first LED 141 and the second LED 142 emitting light of the same color emits light continuously, a driving time of the LEDs 140 can be reduced by half. Accordingly, a time for each LED 140 to emit light while the light emitting display device 400 is being driven can be reduced, so that the lifespan of each of the plurality of LEDs 140 can be increased, and the lifespan of the light emitting display device 400 can be improved.

In addition, in the light emitting display device 400 according to yet another embodiment of the present disclosure, image distortion can be improved by alternately driving the plurality of first LEDs 141 and the plurality of second LEDs 142. That is, by reducing intervals between the plurality of light emitting LEDs 140, a step phenomenon can be prevented, text recognition ability can be improved, and FOS can be improved.

In addition, in the light emitting display device 400 according to yet another embodiment of the present disclosure, the plurality of first LEDs 141 and the plurality of second LEDs 142 that are disposed in two lines sequentially emit light within one frame, so that a driving frequency and resolution recognized by a user may be increased. That is, in the light emitting display device 400 according to yet another embodiment of the present disclosure, since both the first LED 140 and the second LED 142 emit light in the unit pixel P during one frame, the number of sub-pixels SP that implement an image in one frame may be increased. Accordingly, in the light emitting display device 400 according to yet another embodiment of the present disclosure, a driving frequency and resolution actually recognized by a user can be increased without changes in circuits for driving the sub-pixels SP or a driving frequency actually applied.

In addition, in the light emitting display device 400 according to yet another embodiment of the present disclosure, when one of the first LED 141 and the second LED 142 abnormally emits light or cannot emit light, it is possible to prevent a user from recognizing dark lines or dark spots by driving the other with brightness which is more increased than when light can be emitted normally.

Figure 15:
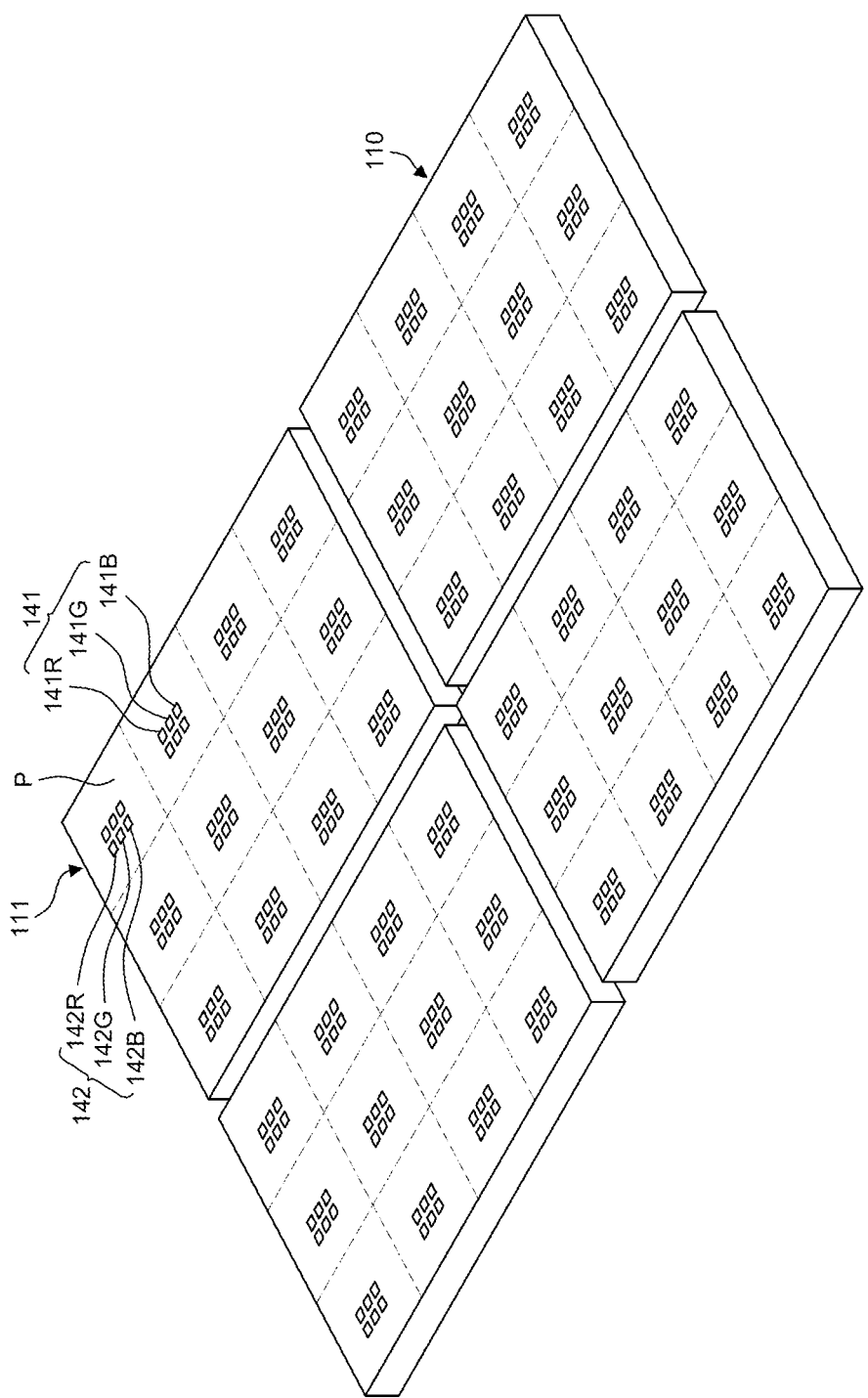
FIG. 15 is a perspective view schematically illustrating a tiling light emitting display device in which light emitting display devices according to various embodiments of the present disclosure are tiled.

FIG. 15 is a perspective view schematically illustrating a tiling light emitting display device in which light emitting display devices according to various embodiments of the present disclosure are tiled. FIG. 15 illustrates the light emitting display devices 100, 200, 300, and 400 according to various embodiments of the present disclosure, in which a plurality of display panels 110 are tiled. The light emitting display device illustrated in FIG. 15 may be a tiling light emitting display device according to one embodiment among the light emitting display devices 100, 200, 300, and 400 according to various embodiments of the present disclosure.

Although FIG. 15 illustrates that four display panels 110 are tiled, the present disclosure is not limited thereto, and the number and arrangement of the display panels 110 may be variously configured. In addition, FIG. 15 illustrates that one display panel 110 is comprised of a total of 12 unit pixels P, but is not limited thereto, and the number and arrangement of unit pixels P disposed in the display panel 110 may be variously configured.

In order to manufacture a plurality of tiled light emitting display devices 100, 200, 300, and 400 according to various embodiments of the present disclosure, the plurality of display panels 110 may be tiled by forming a link line on side surfaces of the display panels 110 on which the plurality of LEDs 140, driving transistors DT and various lines are disposed. Accordingly, the light emitting display devices 100, 200, 300, and 400 according to various embodiments of the present disclosure in which the plurality of display panels 110 are tiled may implement a super-large light emitting display device such as a video wall.

The embodiments of the present disclosure can also be described as follows:

According to an aspect of the present disclosure, a light emitting display device may comprise a display panel including a unit pixel, a first LED disposed in the unit pixel, and a second LED disposed in the unit pixel and emitting light of the same color as the first LED. When the first LED and the second LED are able to emit light normally, the first LED and the second LED alternately emit light.

The first LED may emit light in an odd-numbered frame, and the second LED may emit light in an even-numbered frame.

The first LED and the second LED may sequentially emit light in one frame.

The first LED and the second LED may be disposed in lines.

When one of the first LED and the second LED abnormally emits light or is not able to emit light, the other may be driven brighter than when light is able to be normally emitted.

According to another aspect of the present disclosure, a light emitting display device may comprise a display panel in which a plurality of data lines and a plurality of gate lines are disposed and a plurality of unit pixels are disposed, a data driver connected to the plurality of data lines; a gate driver connected to the plurality of gate lines, and a plurality of first LEDs and a plurality of second LEDs that are disposed in the plurality of unit pixels. A first LED and a second LED that emit light of the same color among the plurality of first LEDs and the plurality of second LEDs are driven by the gate lines different from each other and the data lines identical to each other. The data driver applies a data voltage so that the first LED and the second LED are alternately driven.

The plurality of first LEDs and the plurality of second LEDs may be disposed in two lines side by side.

The first LED and the second LED may be driven by different transistors.

The data driver may supply the data voltage to the first LED among the first LED and the second LED in an (n−1)th frame, and may supply the data voltage to the second LED in an nth frame.

The data driver may supply the data voltage to the first LED and the second LED so that the first LED and the second LED are sequentially driven within one frame.

The data voltages supplied to the first LED and the second LED may be equal to each other.

When the first LED and the second LED are able to normally emit light, the data driver may apply a data voltage so that the first LED and the second LED are alternately driven.

When the first LED is defective or a circuit or line for driving the first LED is defective, the data driver may apply a data voltage that is increased compared to a case in which the first LED is able to normally emit light, to the second LED.

When the first LED or a circuit or line for driving the first LED is defective, the data driver may not supply the data voltage to the first LED.

A distance between the plurality of first LEDs and the plurality of second LEDs in a first unit pixel among the plurality of unit pixels may be smaller than a distance between the plurality of second LEDs in the first unit pixel and the plurality of first LEDs in a second unit pixel adjacent to the first unit pixel.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure includes all the technical concepts and its equivalents described in the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A light emitting display device comprising:
a display panel including a unit pixel;

a first light emitting diode (LED) disposed in the unit pixel;

a second LED disposed in the unit pixel and emitting light of a same color as the first LED, the second LED disposed adjacent to the first LED; and a processing circuit electrically connected to the display panel, the processing circuit, in operation, applies voltage for alternately driving the first LED and the second LED to alternately emit light, when the first LED and the second LED are able to emit light normally.

2. The light emitting display device of claim 1, wherein the first LED emits light in an odd-numbered frame, and
wherein the second LED emits light in an even-numbered frame.

3. The light emitting display device of claim 1, wherein the first LED and the second LED sequentially emit light in one frame.

4. The light emitting display device of claim 1, wherein the first LED and the second LED are disposed in lines.

5. The light emitting display device of claim 1, wherein when one of the first LED and the second LED abnormally emits light or is not able to emit light, the other is driven brighter than when light is able to be normally emitted.

* * * * *